US012812996B2

(12) United States Patent
Shim et al.

(10) Patent No.: US 12,812,996 B2
(45) Date of Patent: Nov. 24, 2026

(54) SEMICONDUCTOR PACKAGES WITH RELIABLE COVERS

(71) Applicant: UTAC Headquarters Pte. Ltd., Singapore (SG)

(72) Inventors: Il Kwon Shim, Singapore (SG); Jeffrey Punzalan, Singapore (SG)

(73) Assignee: UTAC HEADQUARTERS PTE. LTD., Singapore (SG)

( * ) Notice: Subject to any disclaimer, the term of this patent is extended or adjusted under 35 U.S.C. 154(b) by 709 days.

(21) Appl. No.: 18/046,941

(22) Filed: Oct. 17, 2022

(65) Prior Publication Data

US 2023/0122384 A1 Apr. 20, 2023

Related U.S. Application Data

(60) Provisional application No. 63/256,620, filed on Oct. 17, 2021.

(51) Int. Cl.

*H10F 39/00* (2025.01)
*H10W 72/00* (2026.01)
*H10W 90/00* (2026.01)

(52) U.S. Cl.

CPC ....... *H10F 39/8057* (2025.01); *H10F 39/011* (2025.01); *H10F 39/804* (2025.01);
(Continued)

(58) Field of Classification Search

CPC .. H10F 39/8057; H10F 39/011; H10F 39/804; H01L 24/32; H01L 24/48;
(Continued)

(56) References Cited

U.S. PATENT DOCUMENTS

| | | | | |
|---|---|---|---|---|
| 2002/0134988 A1* | 9/2002 | Ishinaga | .............. | H10H 20/853 257/E33.059 |
| 2011/0291215 A1* | 12/2011 | Tu | .......................... | H10F 39/806 438/66 |

(Continued)

*Primary Examiner* — Yasser A Abdelaziez
(74) *Attorney, Agent, or Firm* — Horizon IP Pte. Ltd.

(57) ABSTRACT

A semiconductor package is disclosed. The package includes a package substrate having top and bottom major package substrate surfaces, the top major package surface including a die region. A die having first and second major die surfaces is attached onto the die region. The second major die surface is attached to the die region. The first major die surface includes a sensor region and a cover adhesive region surrounding the sensor region. The package also includes a cover adhesive to the cover adhesive region on the first major die surface. A protective cover with first and second major cover surfaces and side surfaces is attached to the die using the cover adhesive. The second major cover surface contacts the cover adhesive. The protective cover covers the sensor region. The protective cover includes a cover attached to the first major die surface, the cover includes top and bottom major cover surfaces and side cover surfaces. The cover includes an opaque region disposed at a periphery of the bottom cover surface of the cover, the opaque region is configured to prevent flaring or scattering of light. An encapsulant is disposed on the package substrate to cover exposed portions of the package substrate, die and bond wires and side surfaces of the cover, while leaving the first major cover surface exposed.

18 Claims, 25 Drawing Sheets

(52) U.S. Cl.
CPC ........ *H10W 72/884* (2026.01); *H10W 90/734* (2026.01); *H10W 90/754* (2026.01)

(58) Field of Classification Search
CPC ........... H01L 24/73; H01L 2224/32225; H01L 2224/48227; H01L 2224/73265; H01L 2924/00014; H10W 72/884; H10W 90/734; H10W 90/754; H10W 72/30; H10W 72/50
See application file for complete search history.

(56) References Cited

U.S. PATENT DOCUMENTS

| | | | | |
|---|---|---|---|---|
| 2016/0148879 | A1* | 5/2016 | Saxod | H10F 39/011 438/118 |
| 2016/0260761 | A1* | 9/2016 | Jun | H10F 39/804 |
| 2018/0190553 | A1* | 7/2018 | Lin | H10H 20/8506 |
| 2020/0161351 | A1* | 5/2020 | Tan | H10F 39/811 |
| 2020/0312897 | A1* | 10/2020 | Hsieh | H10F 39/804 |
| 2020/0350357 | A1* | 11/2020 | Hung | H01L 24/26 |

* cited by examiner

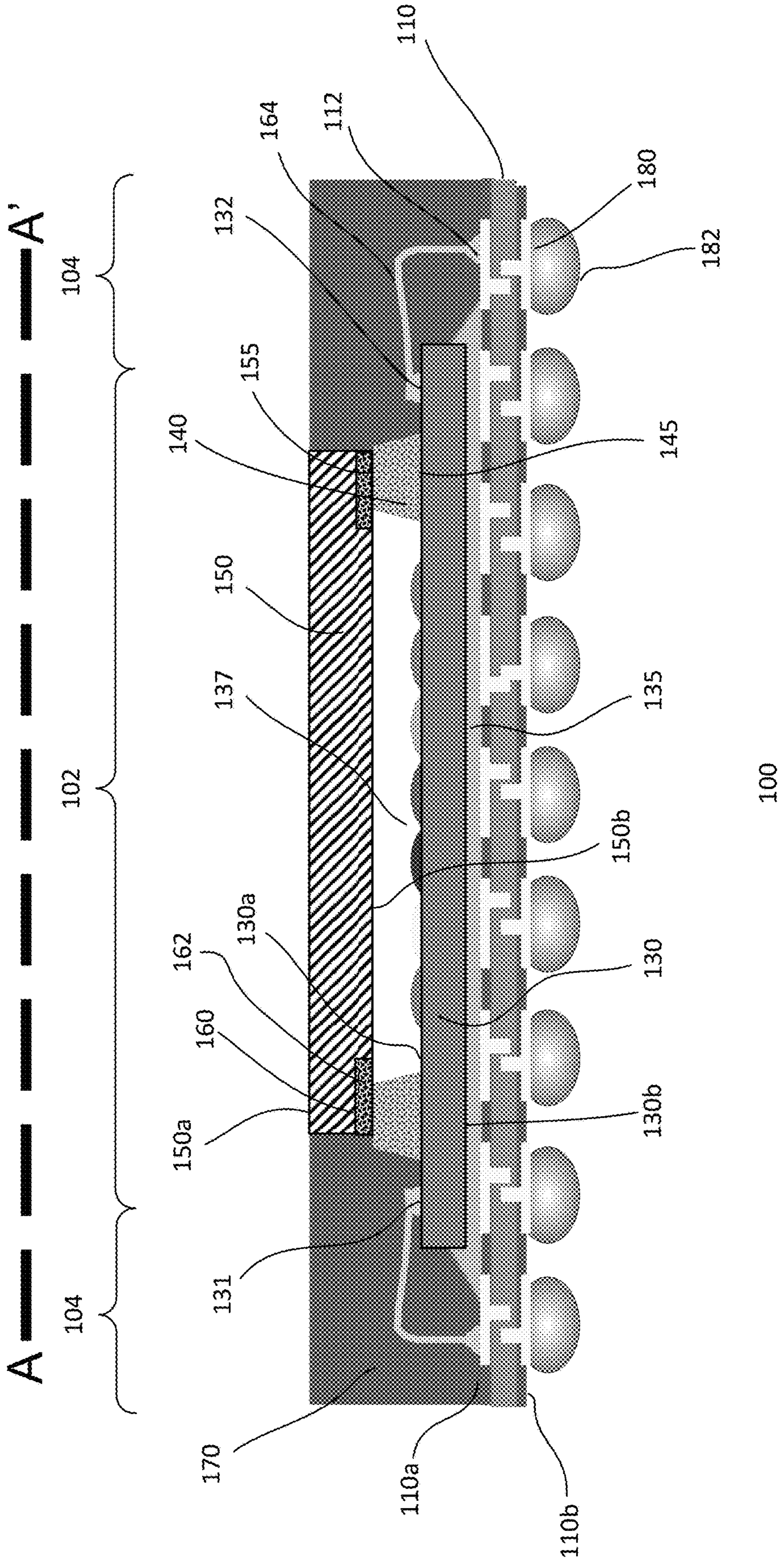
Fig. $1b_1$

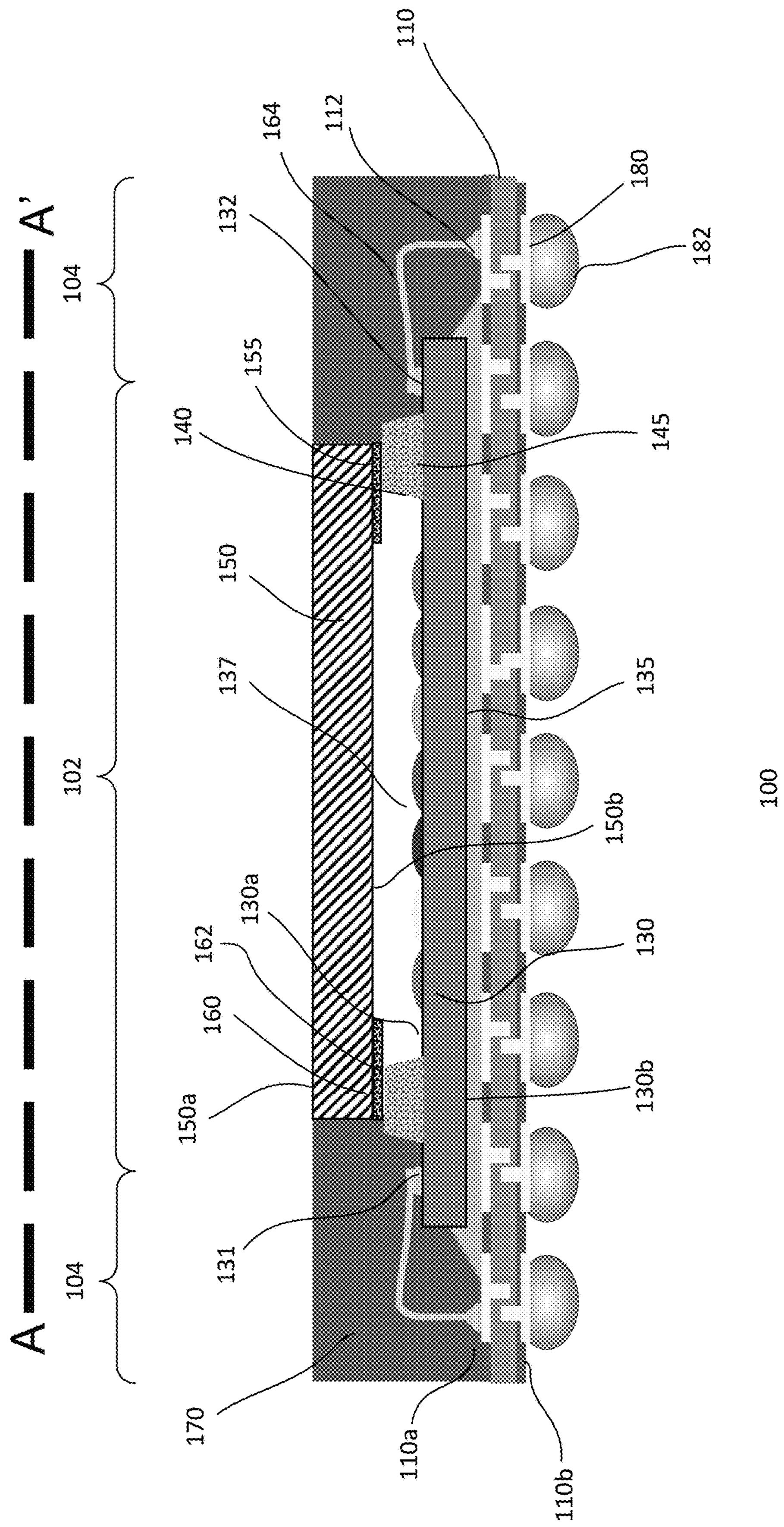
Fig. $1b_2$

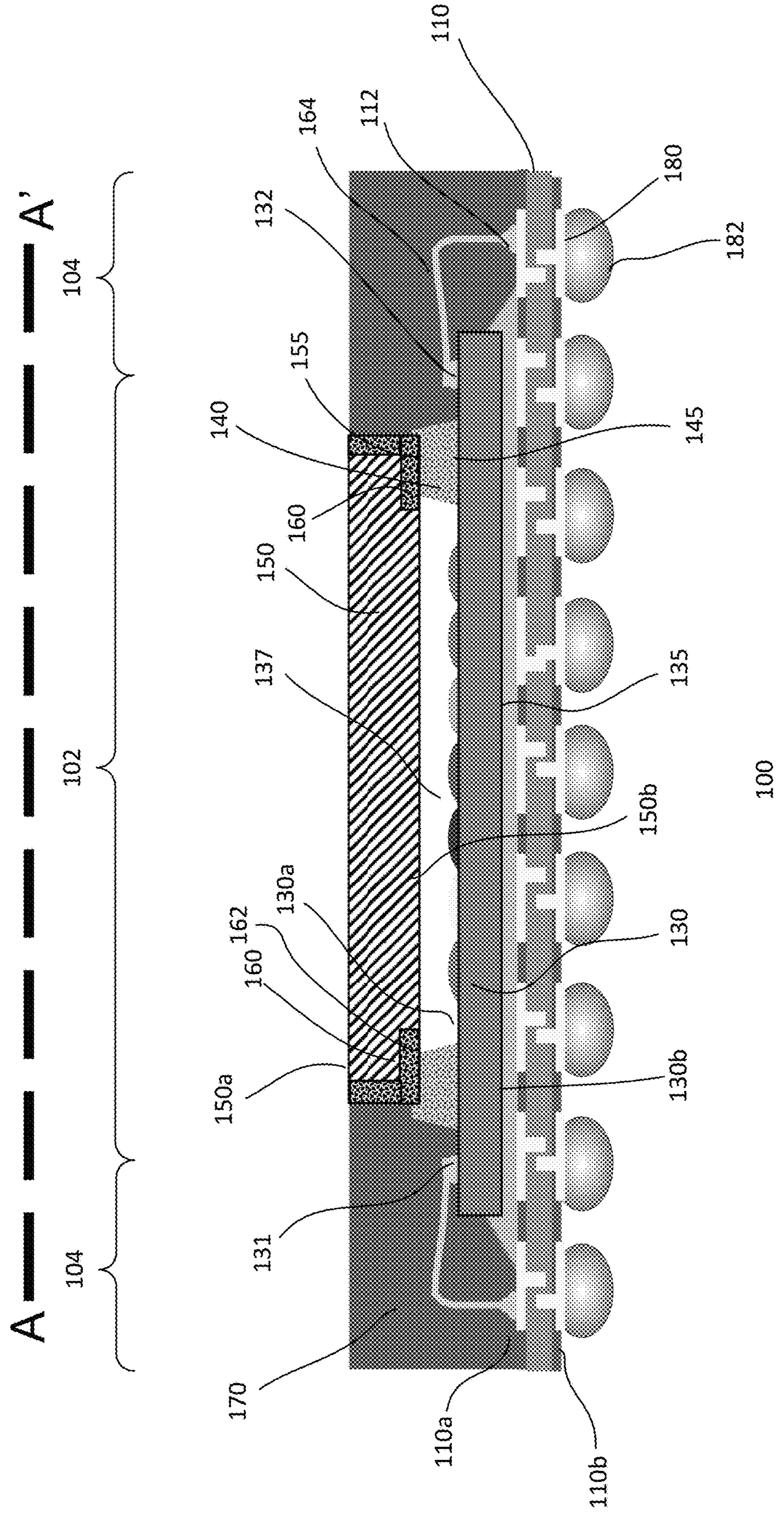
Fig. 1b3

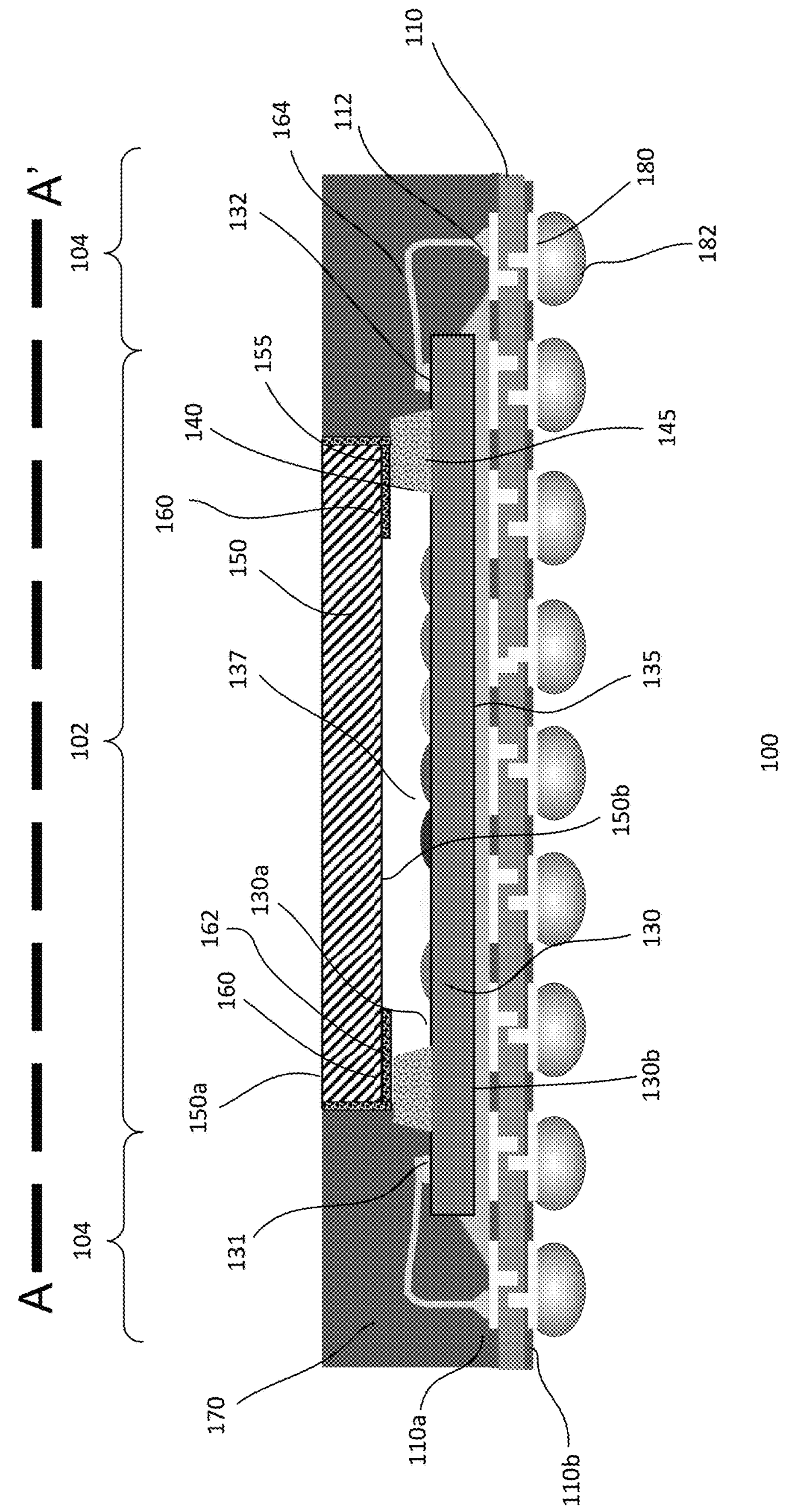
Fig. 1b4

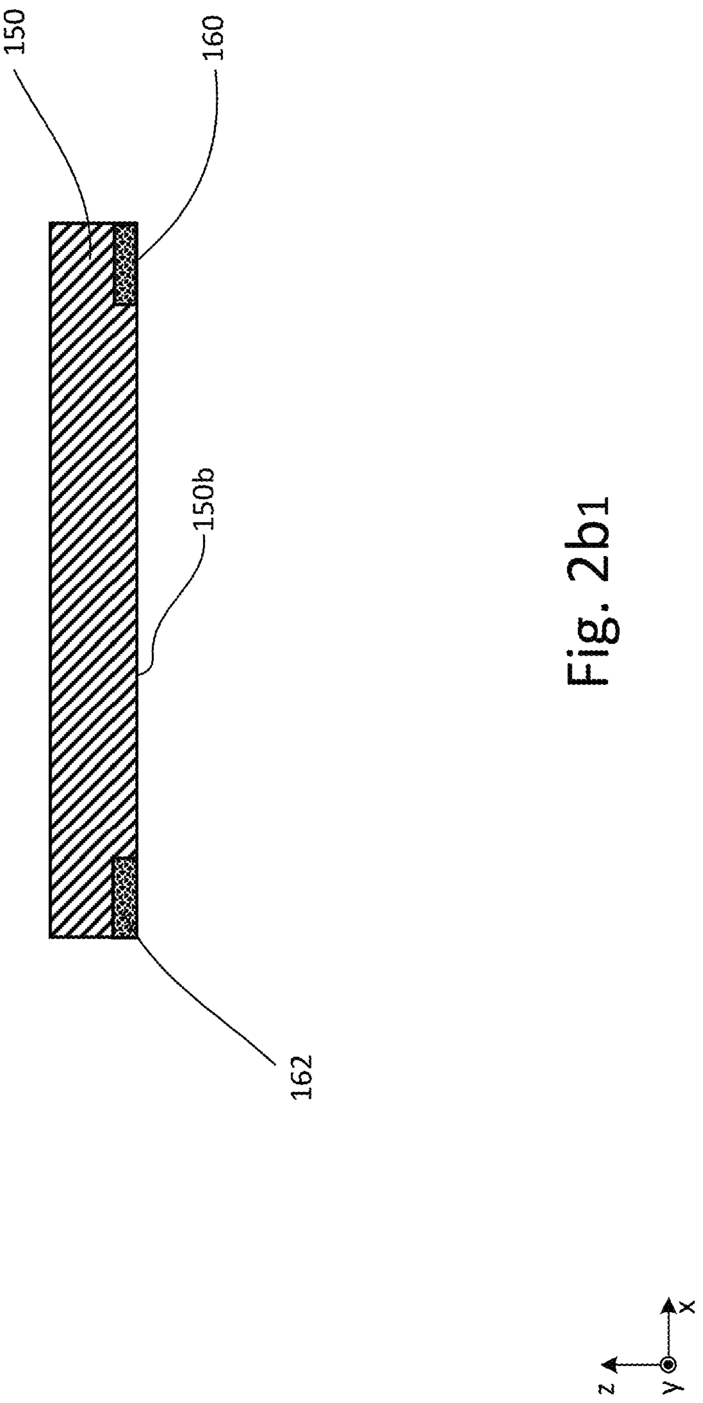
Fig. 2b1

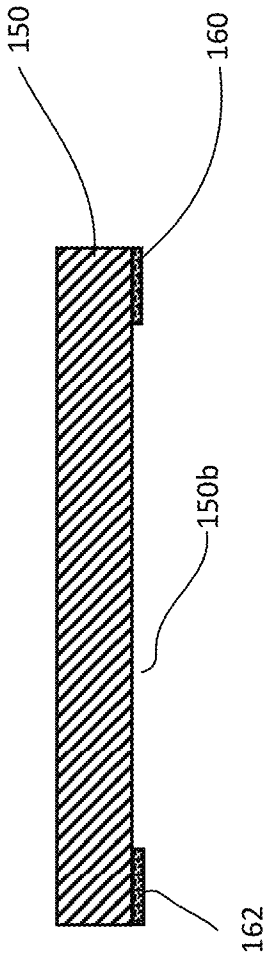
Fig. $2b_2$
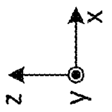

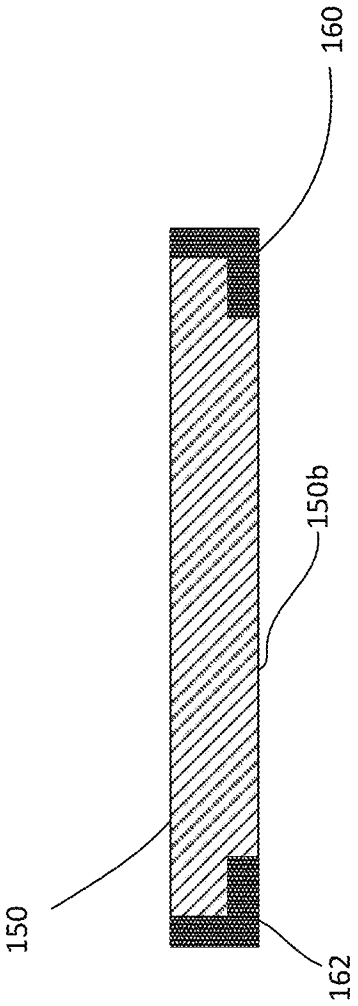
Fig. $2b_3$
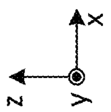

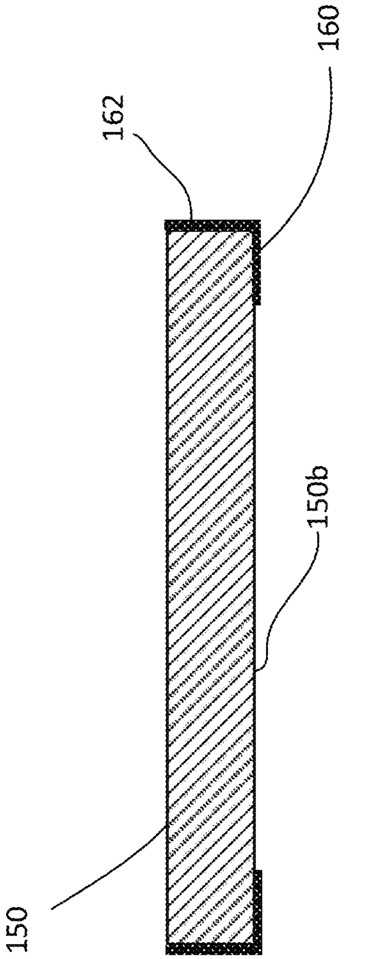
Fig. $2b_4$
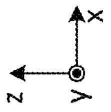

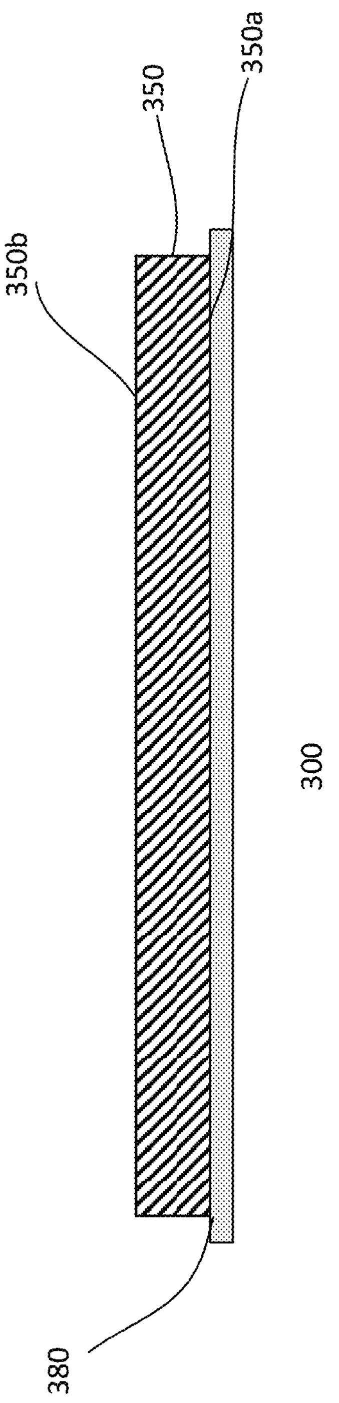
Fig. 3a
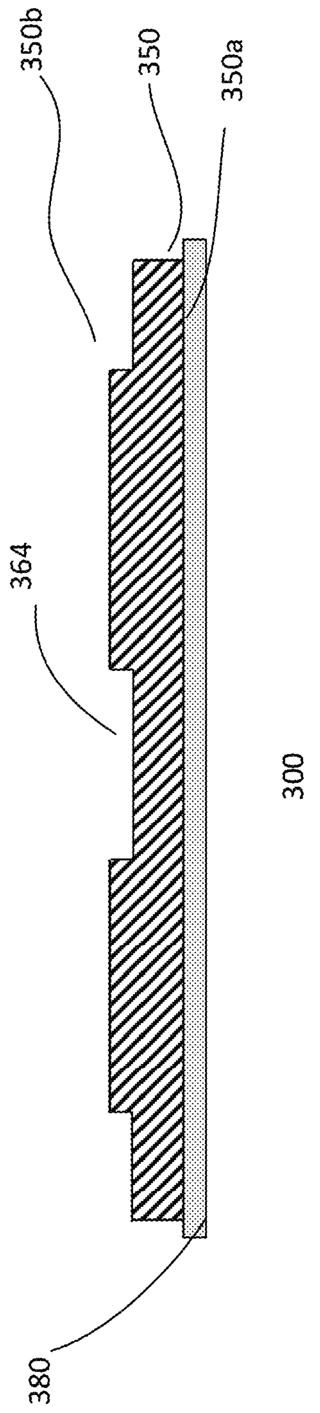
Fig. 3b
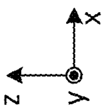

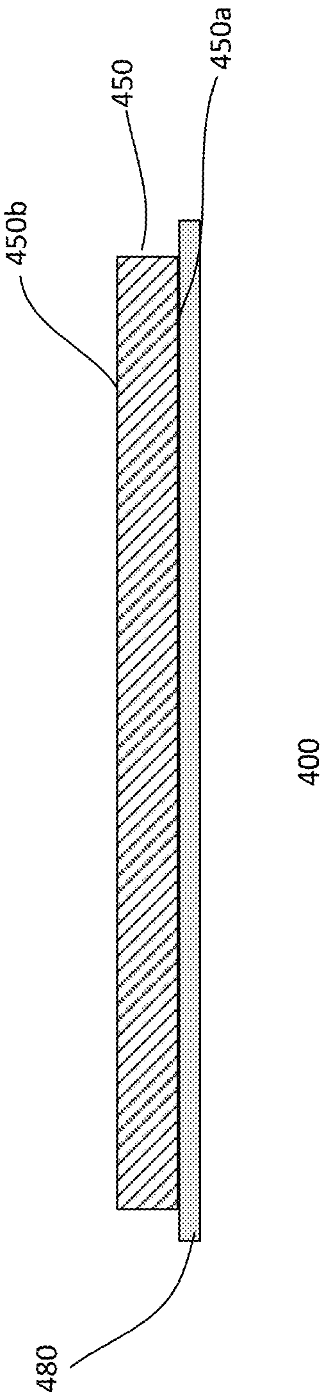
Fig. 4a
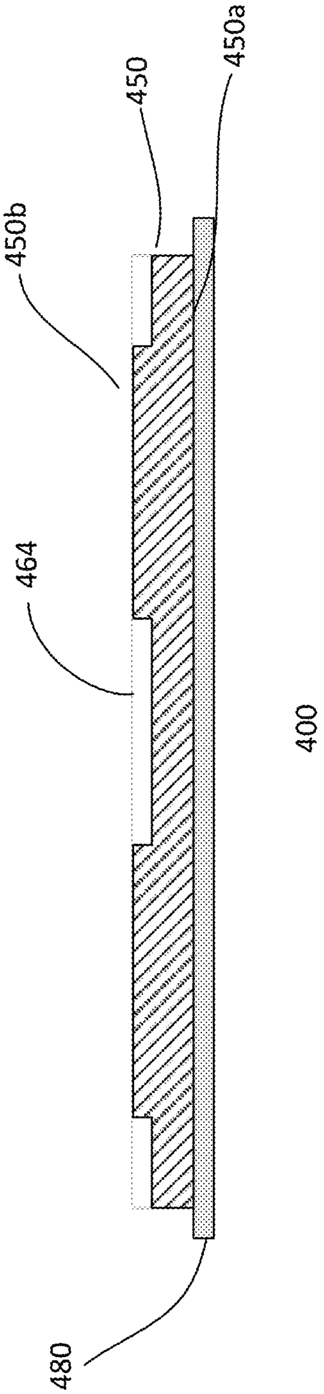
Fig. 4b
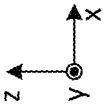

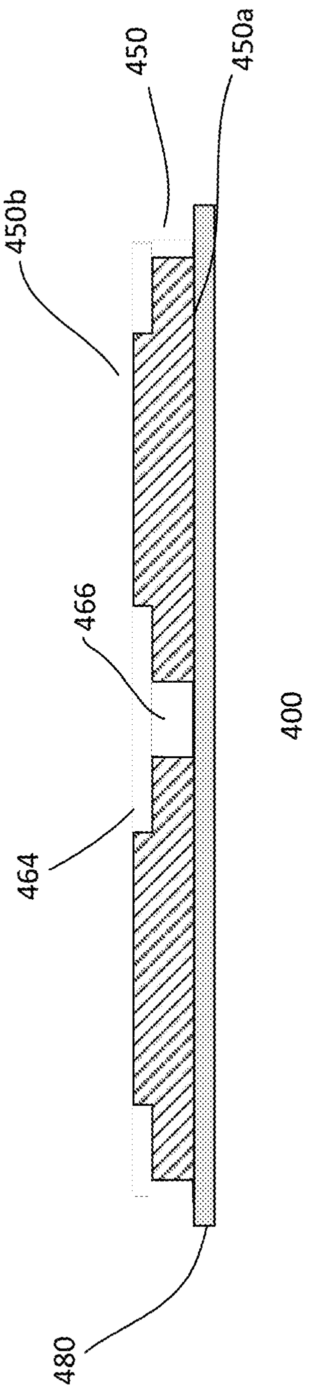
Fig. 4c
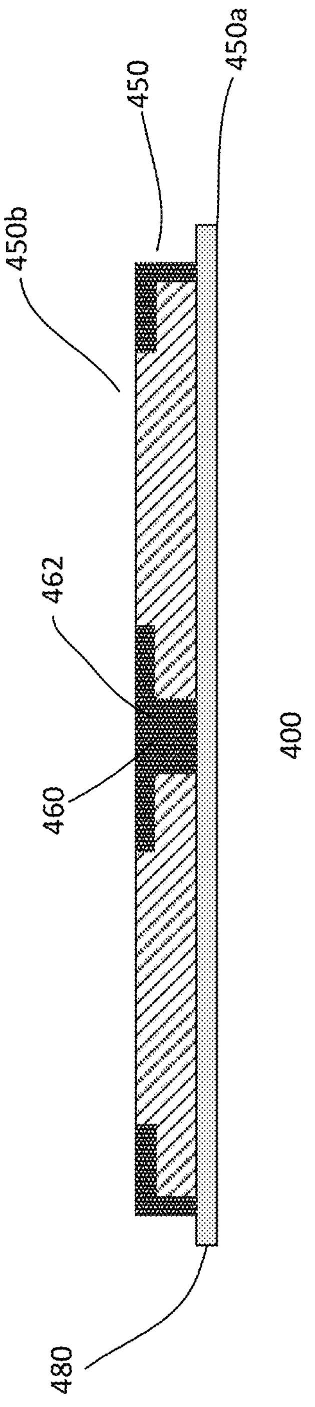
Fig. 4d
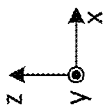

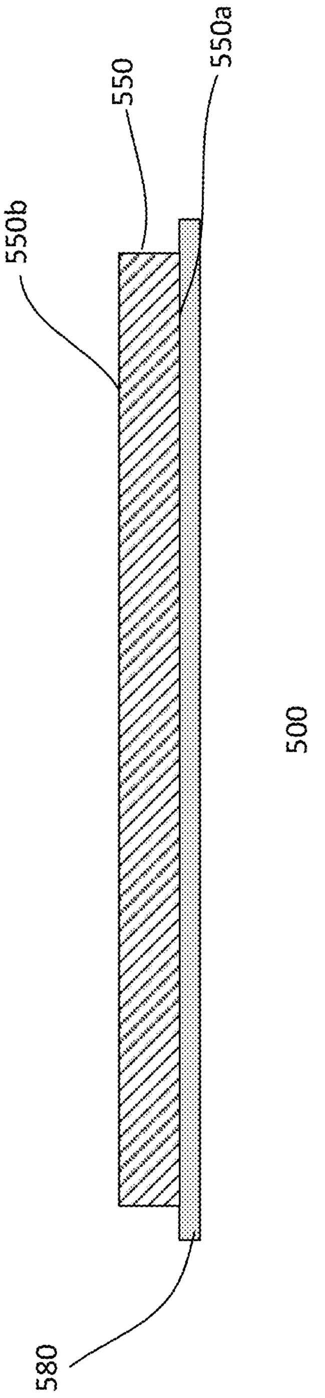
Fig. 5a
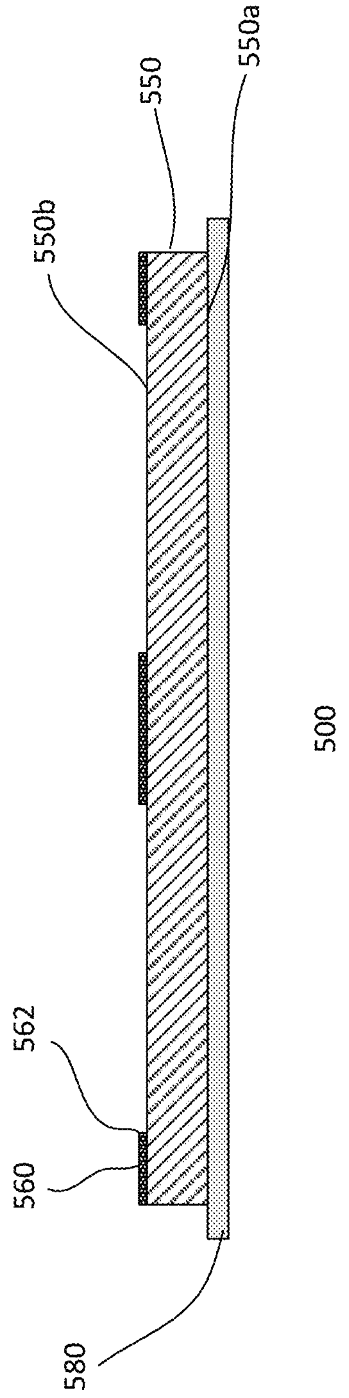
Fig. 5b
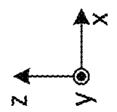

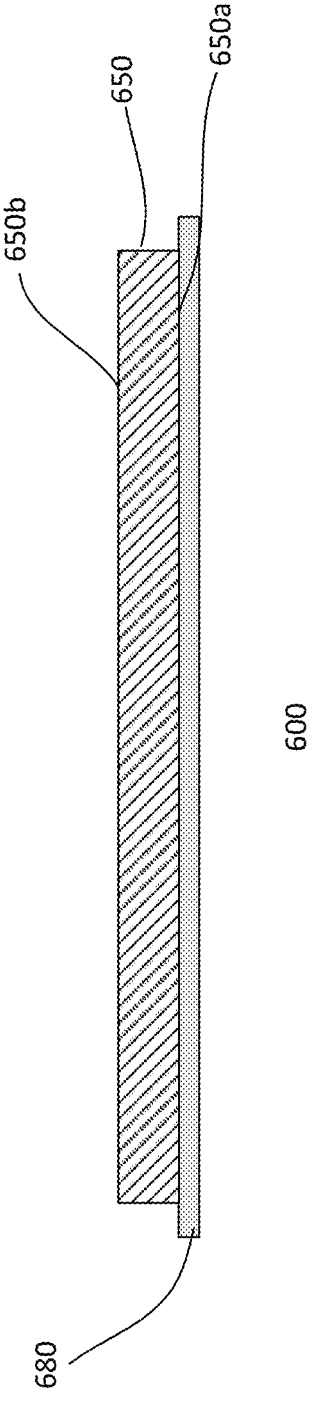
Fig. 6a
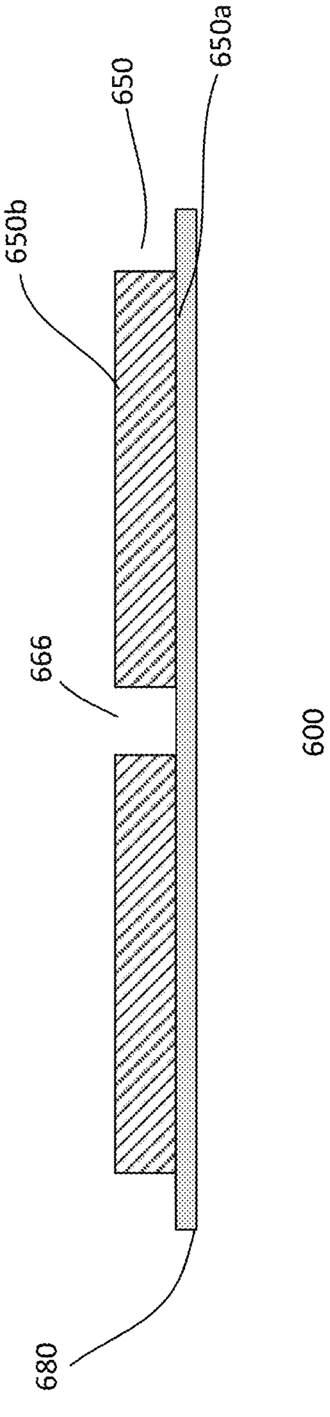
Fig. 6b
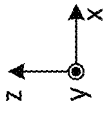

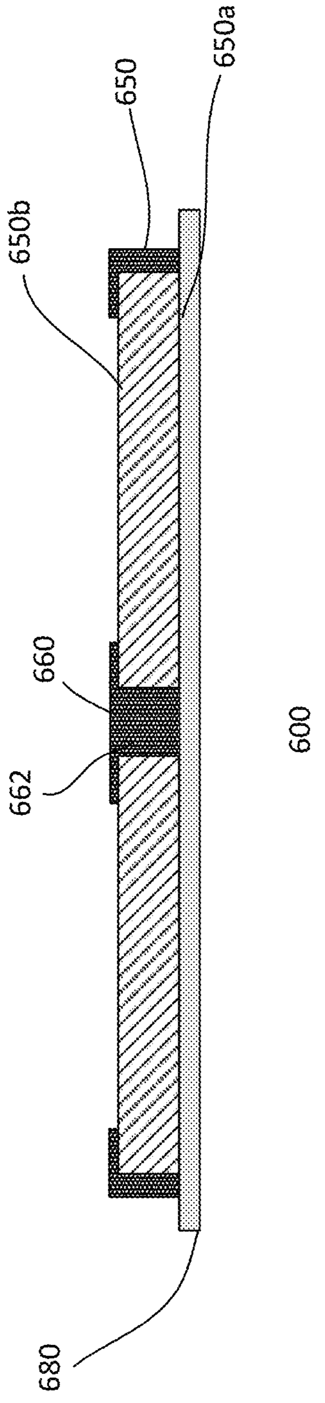
Fig. 6c
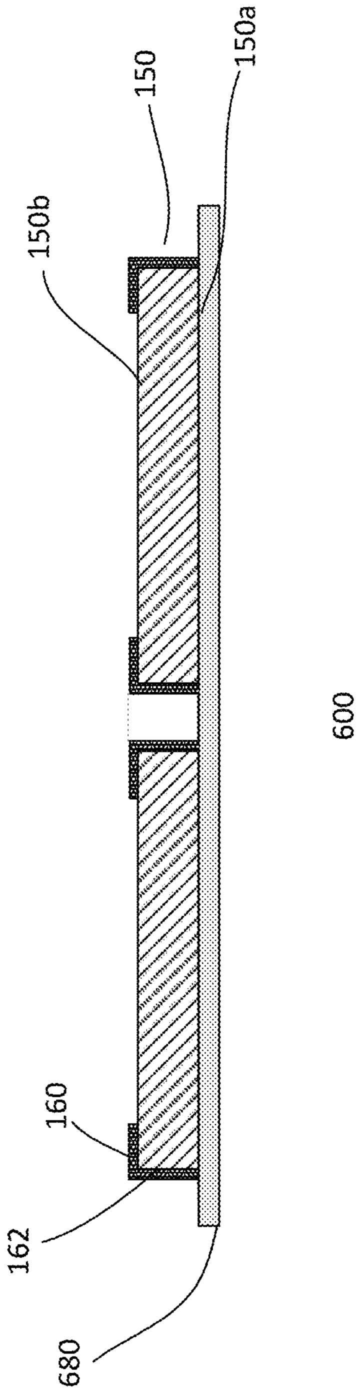
Fig. 6d
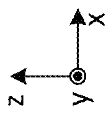

700

SEMICONDUCTOR PACKAGES WITH RELIABLE COVERS

CROSS-REFERENCE TO RELATED APPLICATION

This application claims the benefit of U.S. Provisional Application No. 63/256,620, filed on Oct. 17, 2021. This application cross-references to co-pending U.S. patent application Ser. No. 17/352,348, filed on Jun. 20, 2021. All disclosures are incorporated herein by reference in their entirety for all purposes.

FIELD OF THE INVENTION

The present disclosure relates to semiconductor packages and manufacturing methods of such packages. In particular, the present disclosure relates to semiconductor packages for sensor chips with covers including opaque (nontransparent) regions. More specifically, the present disclosure relates to semiconductor packages for image sensor chips with covers including opaque (nontransparent) regions.

BACKGROUND

Semiconductor packages are employed for packaging semiconductor chips. For example, in the case of sensor packages, they are employed for packaging sensor chips. A sensor chip includes a sensor for sensing non-electrical signals from the surrounding environment. The sensor chip converts the non-electrical signals received into electrical signals that are transmitted to a printed circuit board. For example, an image sensor chip converts incoming light into an electrical signal that can be viewed, analyzed, or stored. Image sensors may be used in electronic imaging devices of both analog and digital types, which include digital cameras, camera modules and medical imaging equipment. Commonly used image sensors may include semiconductor charge-coupled devices (CCD) or active pixel sensors formed using complementary metal-oxide-semiconductor (CMOS) or N-type metal-oxide-semiconductor (NMOS, Live MOS) technologies.

Typically, a sensor package includes a transparent cover, such as glass, over the sensor area of the image sensor chip. The transparent cover permits light to reach the optically active area (sensor) of the sensor chip while creating a sealed cavity to protect the sensor from the environment. However, conventional transparent covers for sensor packages suffer from flaring or scattering of light, which disadvantageously affects the performance of the sensor packages.

From the foregoing discussion, there is a desire to provide semiconductor packages with covers that can prevent flaring or scattering of light, thereby improving the performance of semiconductor sensor packages.

SUMMARY

Embodiments generally relate to semiconductor packages and methods for manufacturing thereof.

In one embodiment, a semiconductor package includes a package substrate having top and bottom major package surfaces. The top major package surface includes a die region. A die is disposed on the die region. The die includes first and second major die surfaces. The second major die surface is attached to the die region of the top major package surface. The first major die surface includes a sensor region with a sensor and a cover adhesive region surrounding the sensor region. A cover is attached to the first major die surface. The cover includes first and second major cover structure surfaces and side surfaces. The cover includes an opaque region disposed at a periphery of the bottom major cover surface of the cover. The opaque region is configured to prevent flaring or scattering of light. The cover structure includes a primary cover structure and a secondary cover structure. A cover bond region is disposed on a bottom major cover surface. The bottom major cover surface faces the die. A cover adhesive is also included. The cover is configured to attach the cover to the die to form a sealed cavity between the cover and sensor region. The adhesive contacts the cover bond region on the bottom major cover structure surface and the cover adhesive on the first major die surface. The semiconductor package also includes an encapsulant which covers exposed portions of the package substrate, die and bond wires and side surfaces of the cover while leaving the first major cover surface exposed.

In another embodiment, a method for forming covers for semiconductor packages is disclosed. The method includes providing a cover substrate. The cover substrate includes opposing top and bottom major cover substrate surfaces. The cover substrate is attached onto a protective film, the top major cover substrate surface of the cover substrate contacts the protective film. The method also includes forming opaque regions on the bottom major cover substrate surface of the cover substrate. The opaque regions are configured for preventing flaring or scattering of light. The cover substrate is singulated at the opaque regions to form a plurality of covers.

In yet another embodiment, a cover for a semiconductor package includes a top cover surface, a bottom cover surface and cover side surfaces. The top and bottom cover surfaces are parallel planar surfaces. The bottom cover surface includes an opaque region disposed at a periphery of the bottom cover surface. The opaque region is configured to prevent flaring or scattering of light.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which:

FIG. 1*a* and FIG. 1$b_1$ show simplified top and cross-sectional views of an embodiment of a semiconductor package;

FIGS. 1$b_2$-1$b_4$ show simplified cross-sectional views of other embodiments of a semiconductor package;

FIGS. 2$b_1$-2$b_4$ show simplified cross-sectional views of various embodiments of a cover with an opaque region corresponding to FIG. 2*a;*

FIGS. 3*a*-3*d* show simplified cross-sectional views of an embodiment of a process for forming a cover with a recessed opaque region;

FIGS. 4a-4e show simplified cross-sectional views of another embodiment of a process for forming a cover with a recessed opaque region;

FIGS. 5a-5c show simplified cross-sectional views of another embodiment of a process for forming a cover with an opaque region;

FIGS. 6a-6d shows another embodiment of a process for forming a cover with an opaque region;

DETAILED DESCRIPTION

Embodiments described herein generally relate to semiconductor packages and methods for forming thereof. In some embodiments, the semiconductor package includes a sensor chip used for sensing environmental signals. In particular, the semiconductor package includes an image sensor chip. The semiconductor package includes a cover over the sensor chip. The cover protects the active sensor chip surface with the sensor(s). In particular, the cover is a transparent cover, such as a glass cover, which includes an opaque region surrounding a periphery thereof. The opaque region prevents flaring or scattering of light to improve package performance. The semiconductor package may include other types of chips with a cover thereover. The semiconductor package may be incorporated into electronic devices or equipment, such as sensing devices, navigation devices, telecommunication devices, computers and smart devices.

Figure 1A:
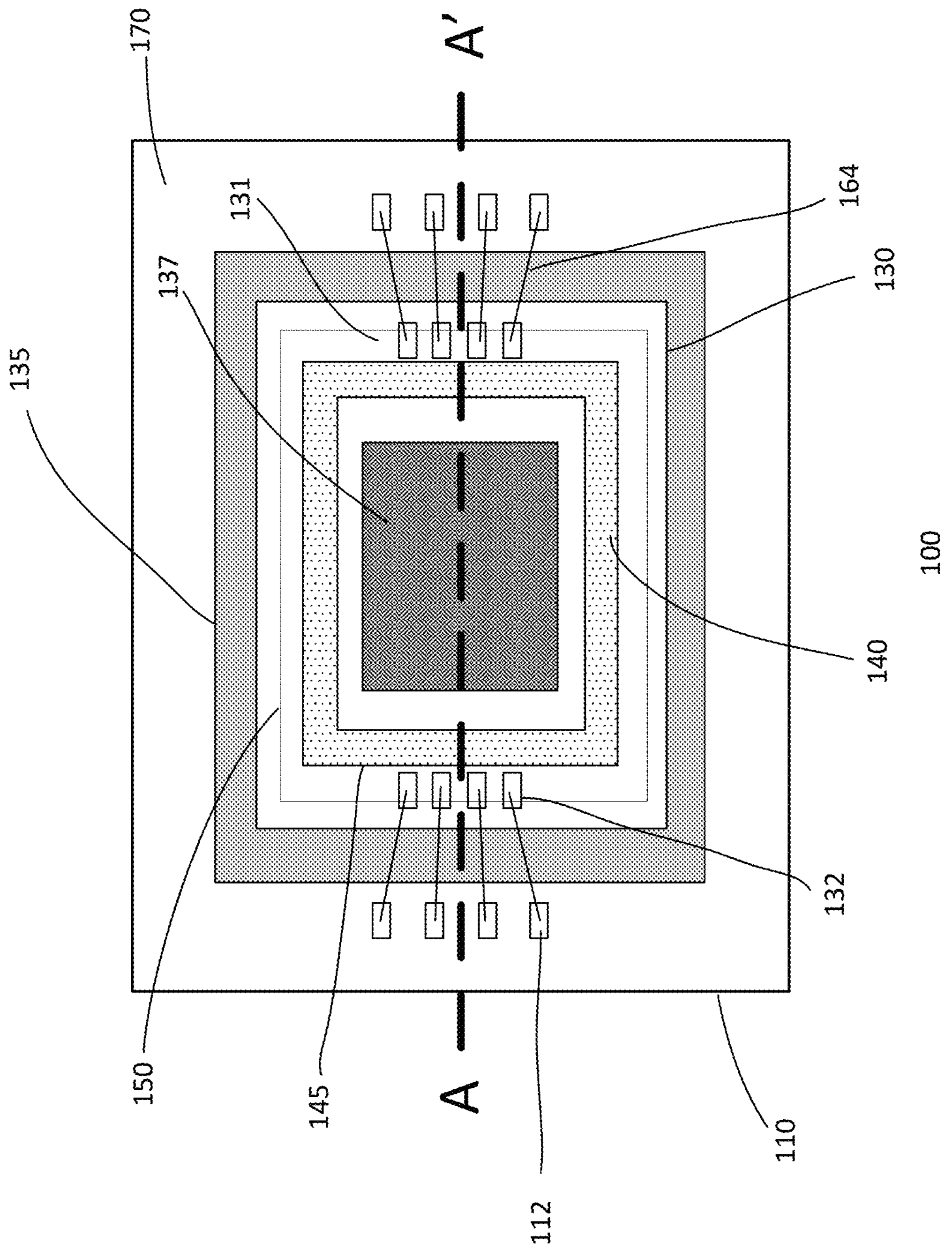

FIGS. 1a-1$b_1$ show simplified top and cross-sectional views along A-A of an embodiment of a semiconductor package, FIGS. 1$b_2$-1$b_4$ show simplified cross-sectional views of other embodiments of semiconductor packages. A semiconductor package 100 is shown. The semiconductor package 100 includes a package substrate 110 having opposing first and second major surfaces 110a and 110b. The first major surface 110a may be referred to as the top substrate surface and the second major surface 110b may be referred to as the bottom substrate surface. The top surface serves as a bonding surface for a die 130. Other designations for the surfaces may also be useful.

The package substrate may be a multi-layer substrate. For example, the package substrate includes a stack of electrically insulating substrate layers. The different layers of the package substrate 110 may be laminated or built-up. In one embodiment, the package substrate 110 is a laminate-based substrate including a core or intermediate layer sandwiched between top and bottom substrate layers. Other types of substrates, including ceramic and leadframe substrates, may also be useful. It is understood that the package substrate 110 may have various configurations, depending on design requirements.

The top surface of the package substrate may be defined with die and non-die regions 102 and 104. The non-die region 104, for example, surrounds the die region 102. For example, the die region may be centrally disposed within the top surface of the package substrate with the non-die region surrounding it. Providing a die region which is not centrally disposed within the top package surface may also be useful.

The top surface of the package substrate may include package bond pads 112. In some embodiments, the top surface of the package substrate includes package bond pads disposed outside the die attach region. The bottom package surface may include package pads 180 and package contacts 182. The package pads, for example, are electrically coupled to the package bond pads of the top surface of the package substrate. For example, each package pad is coupled to its respective package bond pad. The package substrate may include one or more conductive layers embedded therein. The conductive layers may form interconnect structures including conductive traces and contacts for interconnecting the package contacts to package bond pads.

A die or chip 130 is attached to the die region 102 of the top surface of the package substrate. The die, for example, includes first and second opposing major die surfaces 130a and 130b. The first major surface may be referred to as a top or active die surface and the second major surface may be referred to as a bottom or inactive die surface. In one embodiment, the die is a sensor chip. In one embodiment, the die is an image sensor chip. The image sensor chip, for example, detects radiation or light. Other types of chips, for example, non-sensor chips, may also be useful.

The die, as shown, is attached to the die region of the package substrate by a die adhesive 135. The adhesive may be a curable glue or adhesive tape. For example, a curing process may be performed to permanently attach the die to the die region. Other types of die adhesives may also be useful to attach the die to the die region. The bottom surface of the die, for example, is attached to the die region. For example, the inactive die surface is attached to the die region of the package substrate.

In one embodiment, the active die surface includes a sensor region 137. In the case of an image sensor chip, the sensor region may include a photosensitive sensor that may capture image information in response to light. The image sensor may be, for example, a CMOS or CCD type image sensor. Other types of sensors may also be useful. In one embodiment, the sensor region includes an array of sensors. For example, each sensor may correspond to a pixel of an image. The sensor chip may include CMOS components embedded in the chip for controlling the sensor chip. Other configurations of chips may also be useful.

The active die surface may include die bond pads 132 disposed outside of the sensor region. For example, the die bond pads may be disposed on the non-sensor region of the active surface of the die. The die bond pads provide external electrical connections to various components of the chip. In one embodiment, bond wires 164 are provided to couple the package bond pads to the die bond pads. The bond wires enable external connections to the internal circuitry of the die.

A cover or cover structure 150 is disposed on the die over the sensor region. The cover includes first or top and second or bottom opposing major cover surfaces 150a and 150b and side surfaces. In one embodiment, the cover is a rectangular shaped cover with opposing top and bottom surfaces and four side surfaces. Other shaped covers may also be useful. The bottom cover surface 150b, for example, faces the die. The cover is a transparent cover to enable light or radiation to penetrate through to the sensor region 137. For example, the cover may be a glass cover. Other types of transparent covers may also be useful. The cover thickness of the cover may be about 0.4-0.5 mm. Other thicknesses may also be useful.

The cover 150 includes an opaque region 160. In one embodiment, the opaque region is disposed at the periphery of the cover. The opaque region is disposed at least at the periphery of the bottom cover surface 150b facing the die. For example, a rectangular shaped opaque ring extends inwardly from the edge of the bottom surface of the cover surrounding a rectangular shaped transparent center portion. Other configurations of the opaque region may also be useful. For example, other shaped center and periphery portions of the bottom cover surface may also be useful. The transparent center portion is sufficiently large so that light can penetrate to the complete sensor region of the die. For example, the center portion should enable light to penetrate to all the sensors of the sensor region.

In one embodiment, the opaque region is configured to prevent flaring or scattering of light. This improves the performance of the optical package. The width of the opaque region at the bottom cover surface should extend inwardly from the edge beyond the adhesive to prevent scattering. For example, the opaque region extends at least about 25-50 um beyond the adhesive to prevent scattering while enabling light to penetrate to the sensor region. In one embodiment, the opaque region extends about 30-40 um beyond the adhesive to prevent scattering while enabling light to penetrate to the sensor region. Extending the opaque region by other amounts may also be useful. It is understood that the opaque region should not extend into a region which affects active pixel area clearance of the sensor region.

The opaque region, in one embodiment, includes an opaque coating 162. For example, an opaque coating layer is disposed on the opaque region. The opaque coating, for example, may be an encapsulation layer, such as an epoxy mold compound (EMC). Alternatively, the opaque coating may be liquid crystal polymer (LCP) or ink. Other types of opaque coatings, such as solder masks, may also be useful. The opaque coating may be formed by various techniques, such as injection molding, deposition and printing, including inkjet printing. Other techniques may also be useful.

In one embodiment, as shown in FIG. 1$b_1$, the bottom cover surface 150*a* of the cover 150 includes a recess in the opaque region 160 in which the opaque coating 162 is disposed. For example, the recess extends inwardly from the edge of the cover to form a continuous recess ring. In one embodiment, the recess is formed with vertical sidewalls. For example, the recess sidewalls are parallel with the side cover surfaces. In some embodiments, the recess sidewalls may be slanted. For example, the recess sidewalls have a recess angle with respect to the recessed surface which is greater than 90°. For example, the recess angle may be about 90-110°. Other recess angles may also be useful. As for the cover side surfaces, they have a substantially vertical profile with an angle of about 90° with respect to the top and bottom surfaces. Other angles for the cover side surfaces may also be useful. The surface of the opaque coating is coplanar with the bottom cover surface. In one embodiment, the opaque coating may be formed by encapsulation. For example, a needle is used to deposit an encapsulant or a fill material to form the opaque coating. Other types of opaque coatings may also be useful. For example, the opaque coating may be LCP formed by injection molding or an ink coating, such as black ink, formed by ink jet printing. In some embodiments, solder masks may also be used as opaque coatings.

Alternatively, as shown in FIG. 1$b_2$, the opaque region 160 includes an opaque coating 162 disposed on a planar bottom cover surface. In other words, unlike FIG. 1$b_1$, the opaque region on the bottom cover surface does not include a recess. In one embodiment, the opaque coating is an ink layer, such as a black ink layer, formed by ink deposition. Ink deposition, in one embodiment, includes ink jet printing. Other types of opaque coatings or deposition techniques may also be useful. For example, the opaque coating may be LCP formed by injection molding.

In some embodiments, the side surfaces of the cover 150 may also include an opaque coating. For example, the covers shown in FIGS. 1$b_1$ and 1$b_2$ may also include an opaque coating on the side cover surfaces. For example, the opaque coating is on both the side cover surfaces and the periphery of the bottom cover surface. The opaque coating covers the side cover surfaces and the opaque region on the bottom cover surface, as shown in FIGS. 1$b_3$ and 1$b_4$.

An adhesive 140 may be employed to attach the cover 150 over the die. The adhesive, for example, may be referred to as a cover adhesive for bonding the cover to the active surface of the die. In one embodiment, the top die surface includes an adhesive region 145 on which the adhesive 140 is disposed. The adhesive region, for example, surrounds the sensor region 137. In one embodiment, as shown, the adhesive region is disposed on a periphery portion of the die active surface with a gap exposed between the sensor region and inner sides of the adhesive region. For example, an adhesive ring 140 is disposed on the adhesive region surrounding the sensor region for attaching the cover 150 to the die. The adhesive may be a curable adhesive. For example, a curing process may be performed to permanently attach the cover to the die. The curing process, for example, may be performed to permanently attach the die to the die region of the package substrate and the cover to the die.

The cover sufficiently covers the sensor region. For example, the center portion of the bottom cover surface has a rectangular shape which is larger than the sensor region, ensuring that it sufficiently covers the sensor region. Providing a center portion of the bottom cover surface with other shapes may also be useful. The cover forms a vacuum cavity over the sensor region. For example, the cover hermetically seals the sensor region.

As discussed, the top die surface includes die bond pads 132. The die bond pads, for example, are disposed on a pad region 131 on the top or active die surface. As shown, the die bond pads are disposed outside the adhesive region 145. For example, the pad region with the die bond pads is disposed between the cover adhesive region and the edge of the top die surface. The bond pads, for example, are disposed on opposing sides of the sensor region outside the adhesive region. Other configurations of die bond pads and wire bonds may also be useful. For example, the die bond pads may be disposed on the active die surface within the cover adhesive region, such as between the sensor region and the adhesive region. In addition, the die bond pads may be disposed on one side or more than 2 opposing sides of the sensor region.

In one embodiment, the bottom surface of the cover includes a bonding region 155. The bonding region, for example, may be referred to as a cover bonding region. The bonding region is aligned with the adhesive region 145 on the active surface of the die. For example, the bonding region is a continuous ring-shaped region aligned with the cover adhesive region to which the adhesive 140 is bonded on the cover. As shown, the bonding region is part of the opaque region on the bottom cover surface. The opaque region extends beyond the bonding region. Other configurations or arrangements of the cover bonding region may also be useful.

An encapsulant 170 is disposed on the package substrate. The encapsulant 170 covers the package substrate, exposed portions of the die and wire bonds, and sides of the cover 150. The encapsulant leaves the top of the cover exposed. In one embodiment, a top of the encapsulant is coplanar with the top surface of the cover. Providing the top of the encapsulant which is below the top surface of the cover may also be useful. The encapsulant may be a mold compound, such as an epoxy mold compound (EMC). Other types of encapsulants may also be useful. In one embodiment, the encapsulant may be deposited using a needle deposition process. The encapsulant material may have a capillary effort, forming an angle at the edge of each package, which can be visible after singulation.

Figure 2A:
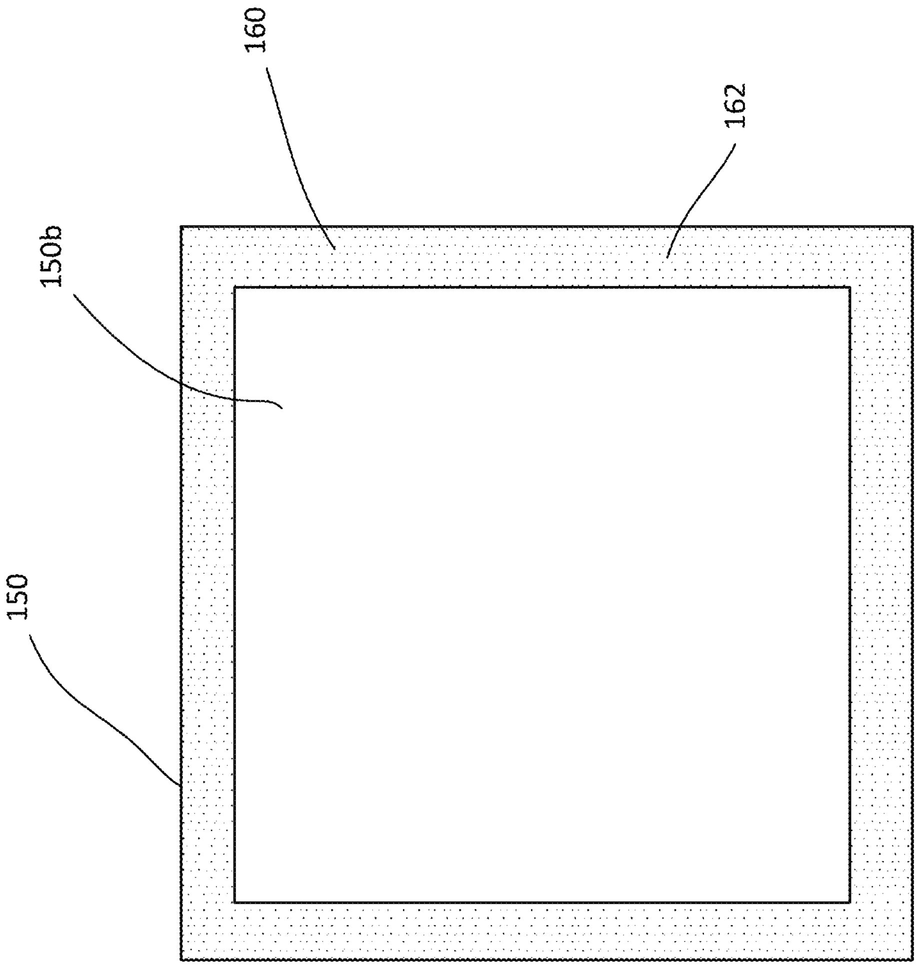
FIG. 2*a* show a simplified bottom view of various embodiments of a cover for a semiconductor package.
Figures 3C, 3D:
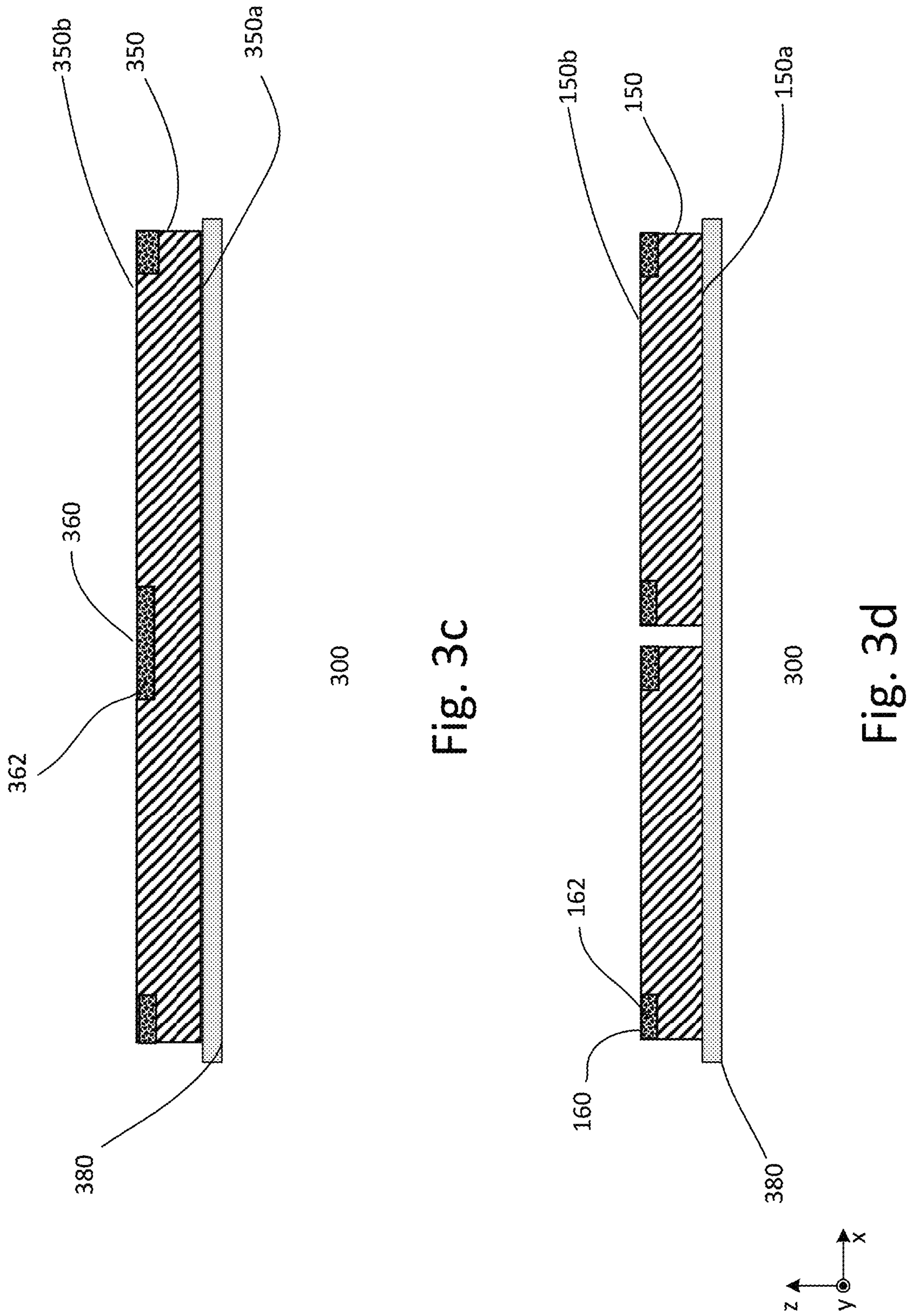
Figure 4E:
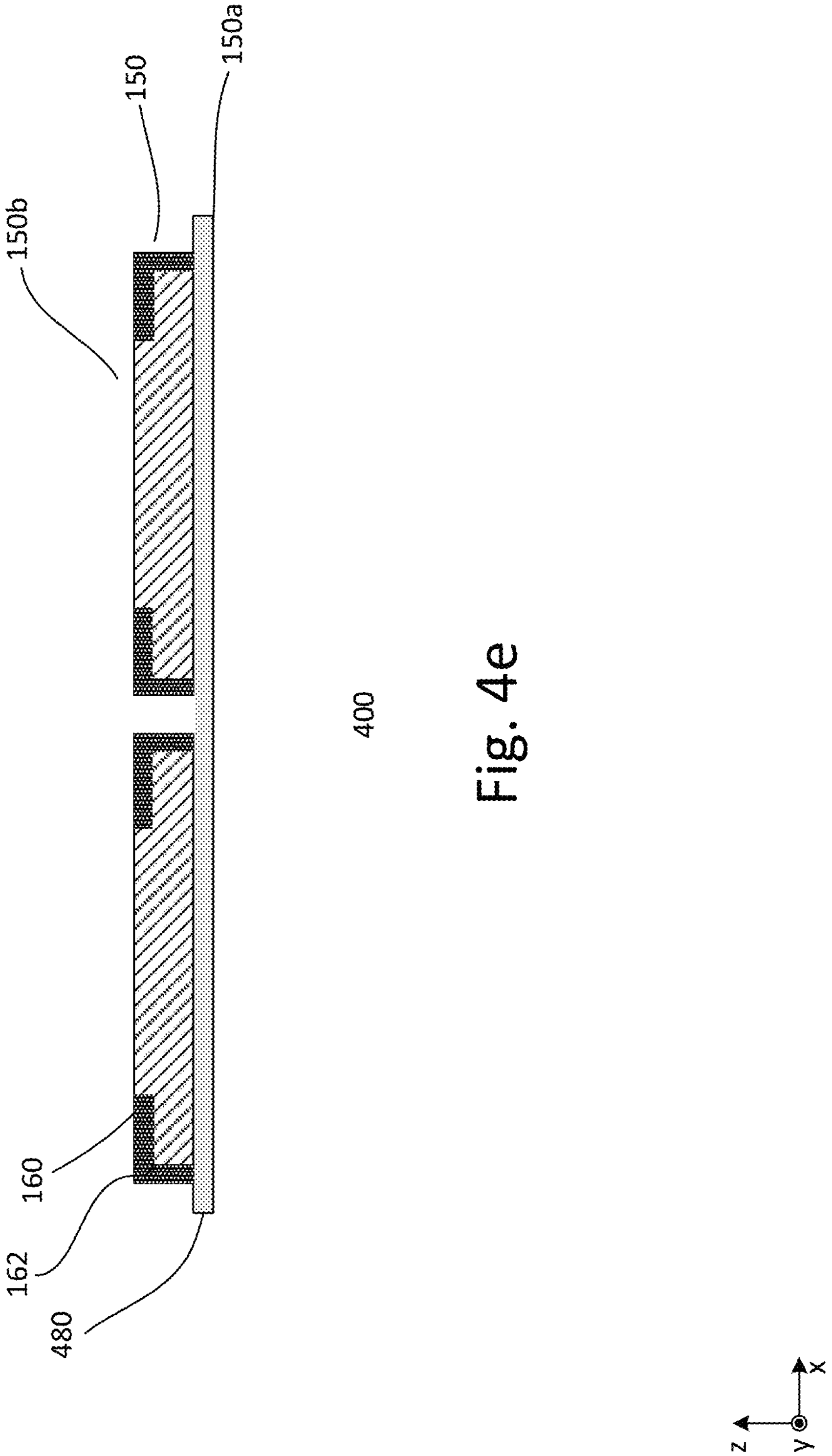

FIG. 2*a* illustrates a simplified bottom view of various embodiments of a cover and FIGS. 2*$b_1$*-2*$b_4$* show simplified cross-sectional views of various embodiments of a cover. The semiconductor package is, for example, the same or similar to those described in FIGS. 1*a* and 1*$b_1$*-1*$b_4$*. For example, the cover is for a semiconductor package with a sensor chip. Common elements and features may not be described or described in detail.

As shown in FIG. 2*a*, the cover 150 includes an opaque region 160. In one embodiment, the opaque region is disposed at the periphery of the cover. The opaque region is disposed at least at the periphery of the bottom cover surface 150*b* facing the die. For example, a rectangular shaped opaque ring extends inwardly from the edge of the bottom surface of the cover surrounding a rectangular shaped transparent center portion. Other configurations of the opaque region may also be useful. For example, other shaped center and periphery portions of the bottom cover surface may also be useful. The transparent center portion is sufficiently large so that light can penetrate to the complete sensor region of the die. For example, the center portion should enable light to penetrate to all the sensors of the sensor region.

In one embodiment, the opaque region is configured to prevent flaring or scattering of light. This improves the performance of the optical package. The width of the opaque region at the bottom cover surface should extend inwardly from the edge beyond the adhesive to prevent scattering. For example, the opaque region extends at least about 25-50 um beyond the adhesive to prevent scattering while enabling light to penetrate to the sensor region. In one embodiment, the opaque region extends about 30-40 um beyond the adhesive to prevent scattering while enabling light to penetrate to the sensor region. Extending the opaque region by other amounts may also be useful. It is understood that the opaque region should not extend into a region which affects active pixel area clearance of the sensor region.

The opaque region, in one embodiment, includes an opaque coating 162. For example, an opaque coating layer is disposed on the opaque region. The opaque coating, for example, may be an encapsulation layer, such as an epoxy mold compound (EMC). Alternatively, the opaque coating may be liquid crystal polymer (LCP) or ink. Other types of opaque coatings, such as solder masks may also be useful. The opaque coating may be formed by various techniques, such as injection molding, deposition and printing. For example, the opaque region may be formed by inkjet printing. Other techniques may also be useful.

In one embodiment, as shown in FIG. 2*$b_1$*, the bottom surface 150*b* of the cover 150 includes a recess in the opaque region 160 in which the opaque coating 162 is disposed. For example, the recess extends inwardly from the edge of the cover to form a continuous recess ring. In one embodiment, the recess is formed with vertical sidewalls. For example, the recess sidewalls are parallel with the side cover surfaces. In some embodiments, the recess sidewalls may be slanted. For example, the recess sidewalls have a recess angle with respect to the recessed surface which is greater than 90°. For example, the recess angle may be about 90-110°. Other recess angles may also be useful. As for the cover side surfaces, they have a substantially vertical profile with an angle of about 90° with respect to the top and bottom surfaces. Other angles for the cover side surfaces may also be useful. The surface of the opaque coating is coplanar with the bottom cover surface. In one embodiment, the opaque coating may be formed by encapsulation. For example, a needle is used to deposit an encapsulant or a fill material to form the opaque coating. Other types of opaque coatings may also be useful. For example, the opaque coating may be LCP formed by injection molding or an ink coating, such as black ink, formed by ink jet printing. In some embodiments, a solder mask may be used as opaque coatings.

Alternatively, as shown in FIG. 2*$b_2$*, the opaque region 160 includes an opaque coating 162 disposed on a planar bottom cover surface. In other words, unlike FIG. 2*$b_1$*, the opaque region on the bottom cover surface does not include a recess. In one embodiment, the opaque coating is an ink layer, such as a black ink layer, formed by ink deposition. Ink deposition, in one embodiment, includes ink jet printing. Other types of opaque coatings may also be useful. For example, the opaque coating may be LCP formed by injection molding.

In some embodiments, the side surfaces of the cover 150 may also include an opaque coating. For example, the covers shown in FIGS. 2*$b_1$* and 2*$b_2$* may also include an opaque coating on the side cover surfaces. For example, the opaque coating is on both the side cover surfaces and the periphery of the bottom cover surface. The opaque coating covers the side cover surfaces and the opaque region on the bottom cover surface, as shown in FIGS. 2*$b_3$* and 2*$b_4$*.

FIGS. 3*a*-3*d* show simplified cross-sectional views of an embodiment of a process for forming a cover with a recessed opaque region for a semiconductor package. The semiconductor package is, for example, the same or similar to those described in FIGS. 1*a*-1*$b_4$*. Common elements and features may not be described or described in detail.

Referring to FIG. 3*a*, the process includes providing a cover substrate 350 which is laminated on a protective film 380. The cover substrate, for example, is employed to form a plurality of covers with opaque regions. The cover substrate, for example, is a cover sheet, such as a glass sheet, used in forming a plurality of covers. Other types of cover sheets, such as a wafer glass, may also be useful. As shown, the cover sheet includes opposing top and bottom cover substrate surfaces 350*a* and 350*b*. Typically, the cover sheet may have a thickness of about 0.4-0.5 mm. Other thicknesses may also be useful. As for the protective film 380, it may be a dicing film which includes a base layer with an adhesive thereon. The top surface 350*a* of the cover substrate is attached onto the protective film 380. For example, the top cover substrate surface 350*a* is attached onto the adhesive of the protective film. Other types and configurations of protective films, such as a double-sided adhesive film, may also be useful.

In one embodiment, the cover sheet is processed to form a plurality of covers having recessed structures 364, such as those described in FIGS. 1*$b_1$* and 2*$b_1$*. In one embodiment, recessed structures are formed in the cover sheet using a saw (not shown). For example, the cover sheet is mounted onto a translatable and rotatable table for sawing. The saw, for example, is a rotary saw. To form the recessed structures, the saw cuts the cover sheet along first and/or second directions. The first and second directions, for example, are orthogonal directions, such as x and y directions. In the case that the recessed structure is formed only on opposing first sides or opposing second sides, the saw cuts along the first direction or the second direction. In the case that the recessed structure is formed on four sides, the saw cuts are formed along the first direction and the second direction.

The blade of the saw, for example, is configured to create the recessed structure. Depending on the width of the saw blade and the desired width w1 of the recess, a single cut or multiple cuts may be performed. For example, if the width of the saw blade is equal to w1, a single cut may be performed to create the recess structure. In the case where the saw blade is narrower than w1, multiple cuts may be performed to create the recessed structure. The saw may be configured to produce the desired cross-sectional profile. For example, the shape of the saw blade may be configured to produce a rectangular shaped profile of the recessed structure. Other profile shapes may also be useful.

The saw cuts the cover sheet in the y direction to produce recessed structures 364 along the y direction. For example, after a first recess or groove corresponding to the recess structure is formed, the cover sheet is translated to make additional cuts to form additional grooves. For example, a pair of grooves may form opposing sides of a recess structure.

As shown, the profile of the grooves is a rectangular shaped profile. Other profile shapes may also be useful. After grooves are completed in the y direction, the cover sheet may be rotated to form grooves in the x direction. This, for example, forms grooves along the full length of the glass sheet in the x and y directions. As such, rectangular-shaped recess structures are created on the surface of the cover sheet. The grooves, for example, have a depth of about 35-45 nm. Other depths may also be useful.

After the recess structures for opaque regions are formed, an encapsulation process is performed to form opaque coatings 362 on opaque regions 360 in the recess structures. The opaque coating, for example, may be an encapsulation layer, such as an epoxy mold compound (EMC). Alternatively, the opaque coating may be liquid crystal polymer (LCP) or ink. Other types of opaque coatings, such as a solder mask material, may also be useful. The opaque coating may be formed by various techniques, such as injection molding, deposition and printing, including inkjet printing. Other techniques may also be useful.

The cover sheet is singulated at the opaque regions including opaque coatings to form a plurality of individual covers 150 with opposing top and bottom cover surfaces 150*a* and 150*b*. For example, the saw fully cuts the cover sheet in the x and y directions, separating it into individual covers. The resulting protective covers may be similar to that shown in FIG. 2*b*$_1$, with opaque coatings 162 on the opaque regions 160 at the periphery of the bottom cover surface 150*b* of the cover.

In another embodiment, as shown in FIGS. 4*a*-4*e*, covers similar to FIG. 2*b*$_3$ are formed. As discussed above, after the cover sheet is partially cut from the bottom cover sheet surface in FIG. 4*b*, a second cutting process is performed to fully cut the cover sheet. The second cutting process forms a second groove 466 with a second width w2. The second groove 466 is narrower the groove 464, resulting in a plurality of step-shaped transparent regions. The second cutting process may be similar to the partial cutting process for forming the groove 464. For example, the second groove 466 is formed by using a saw (not shown) with a single or multiple cuts. Other techniques for forming the second groove may also be useful. An encapsulation process is performed after formation of the grooves 464 and 466 to form opaque coatings 462 on opaque regions 460. The opaque coating, for example, may be an encapsulation layer, such as an epoxy mold compound (EMC). Alternatively, the opaque coating may be liquid crystal polymer (LCP) or ink. Other types of opaque coatings, such as solder masks, may also be useful. The opaque coating may be formed by various techniques, such as injection molding, deposition and printing, including inkjet printing. Other techniques may also be useful.

The cover sheet is singulated at the opaque regions including opaque coatings to form a plurality of individual covers 150 with opposing top and bottom cover surfaces 150*a* and 150*b* as well as side surfaces, leaving opaque coatings 162 on the opaque region 160 at the periphery of the bottom cover surface and side surfaces of the cover. The opaque coating on the side surfaces protects side walls of the cover, reducing cracking during processing.

Figure 5C:
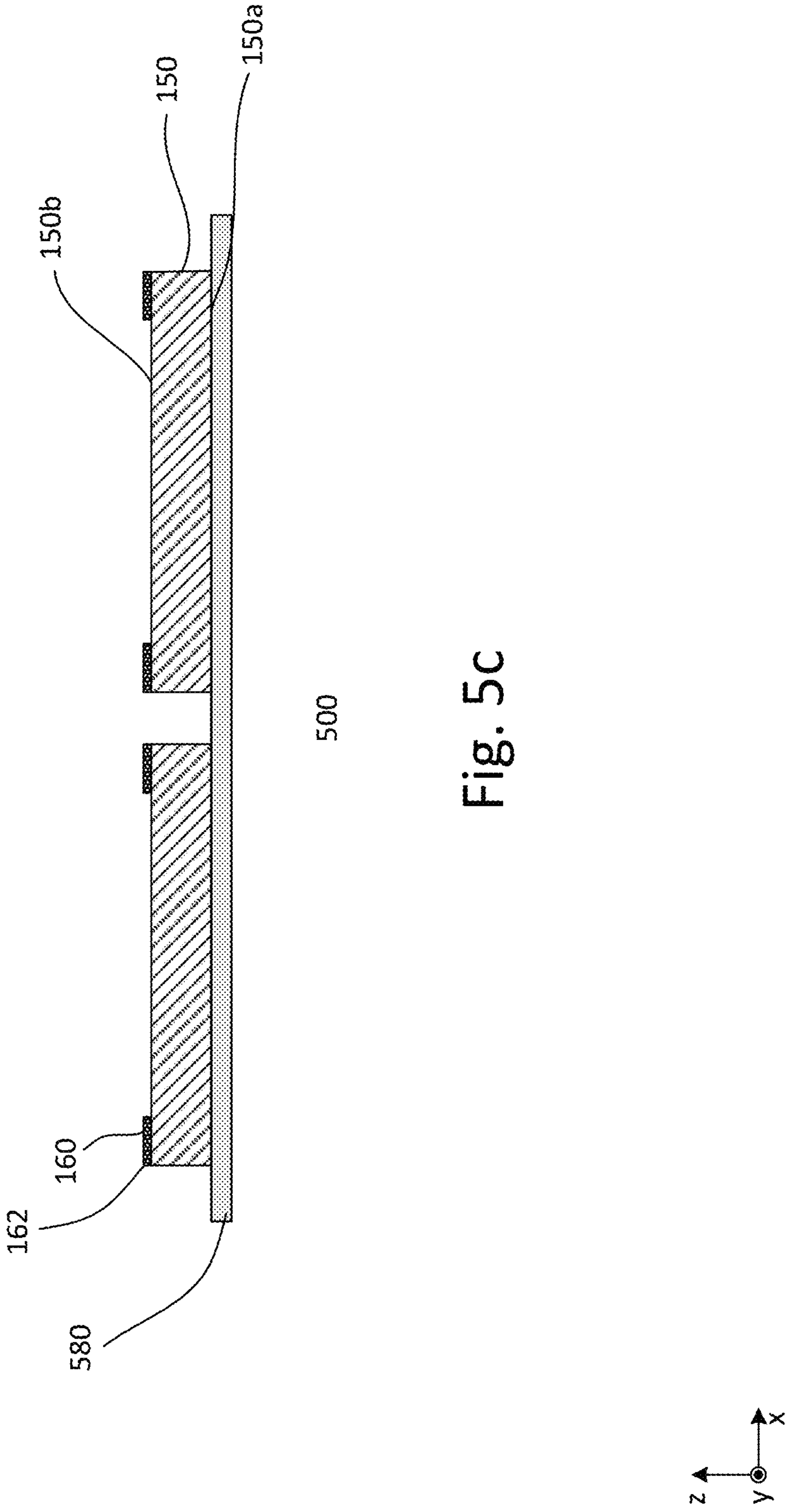
Figure 7A:
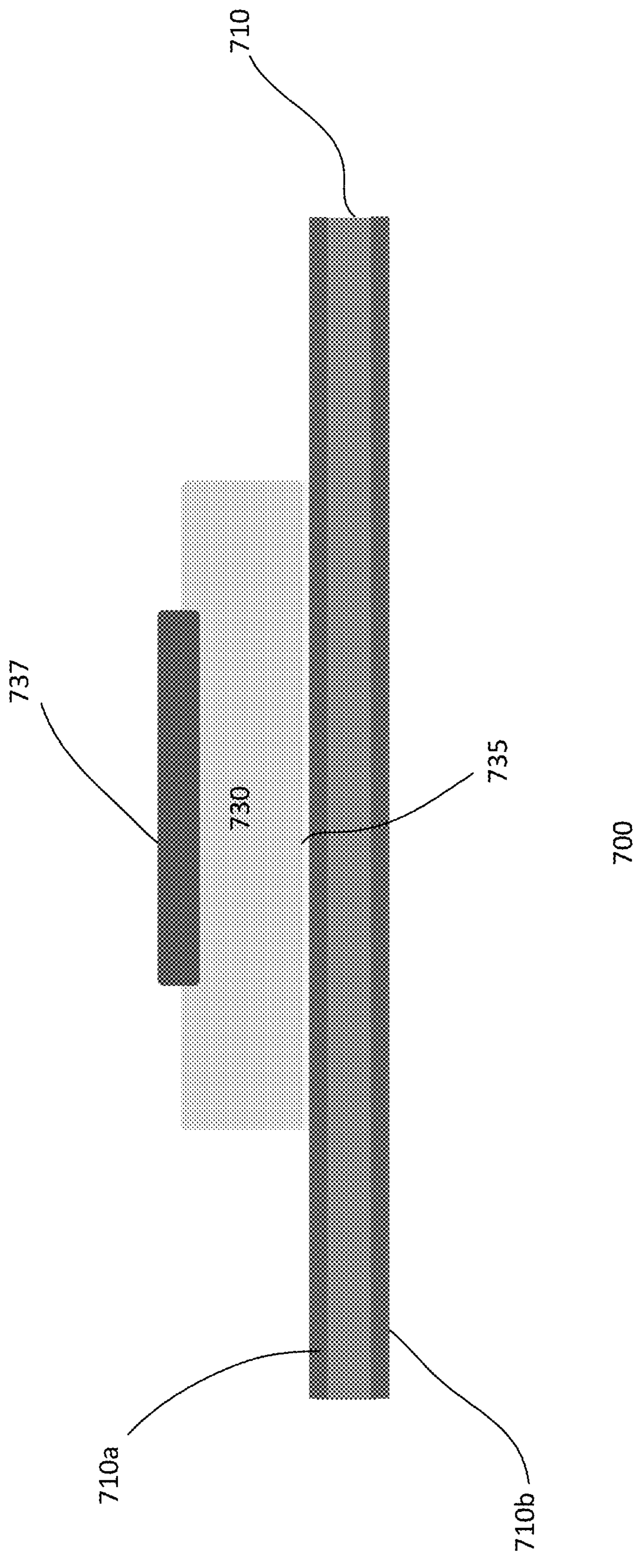
FIGS. 7a-7e show simplified cross-sectional views of an embodiment of a process flow for forming a semiconductor package.
Figure 7B:
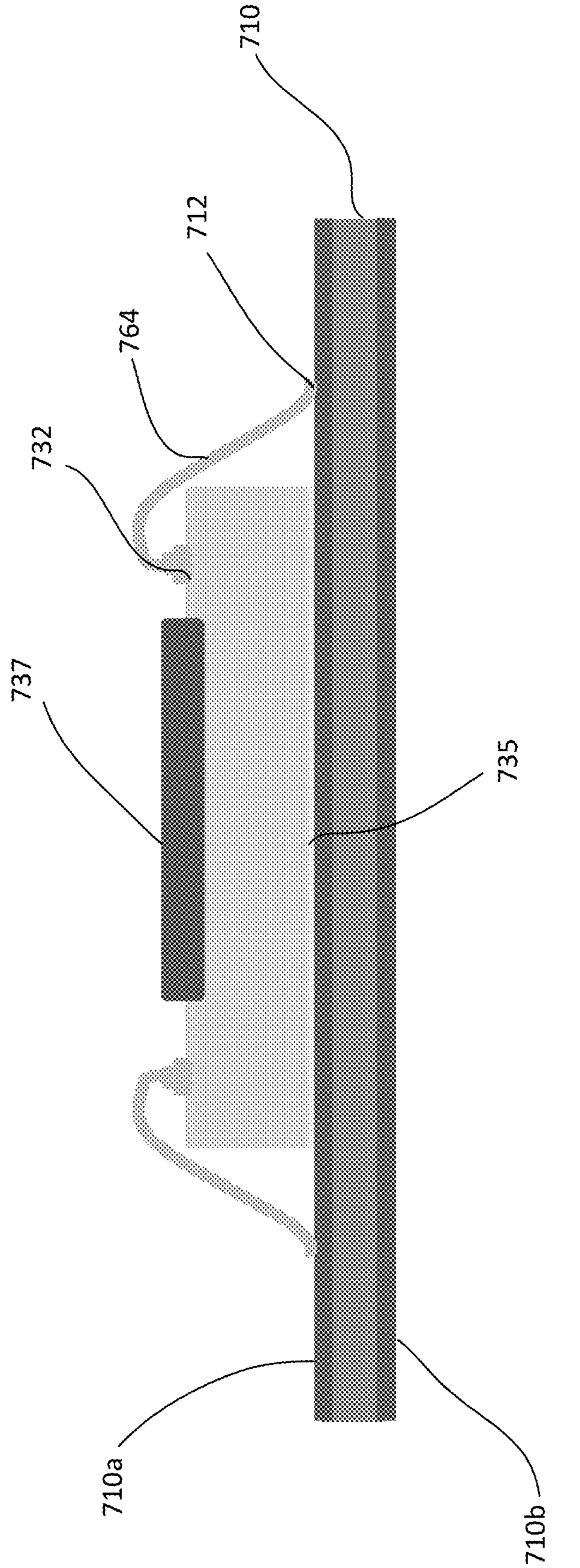
Figure 7C:
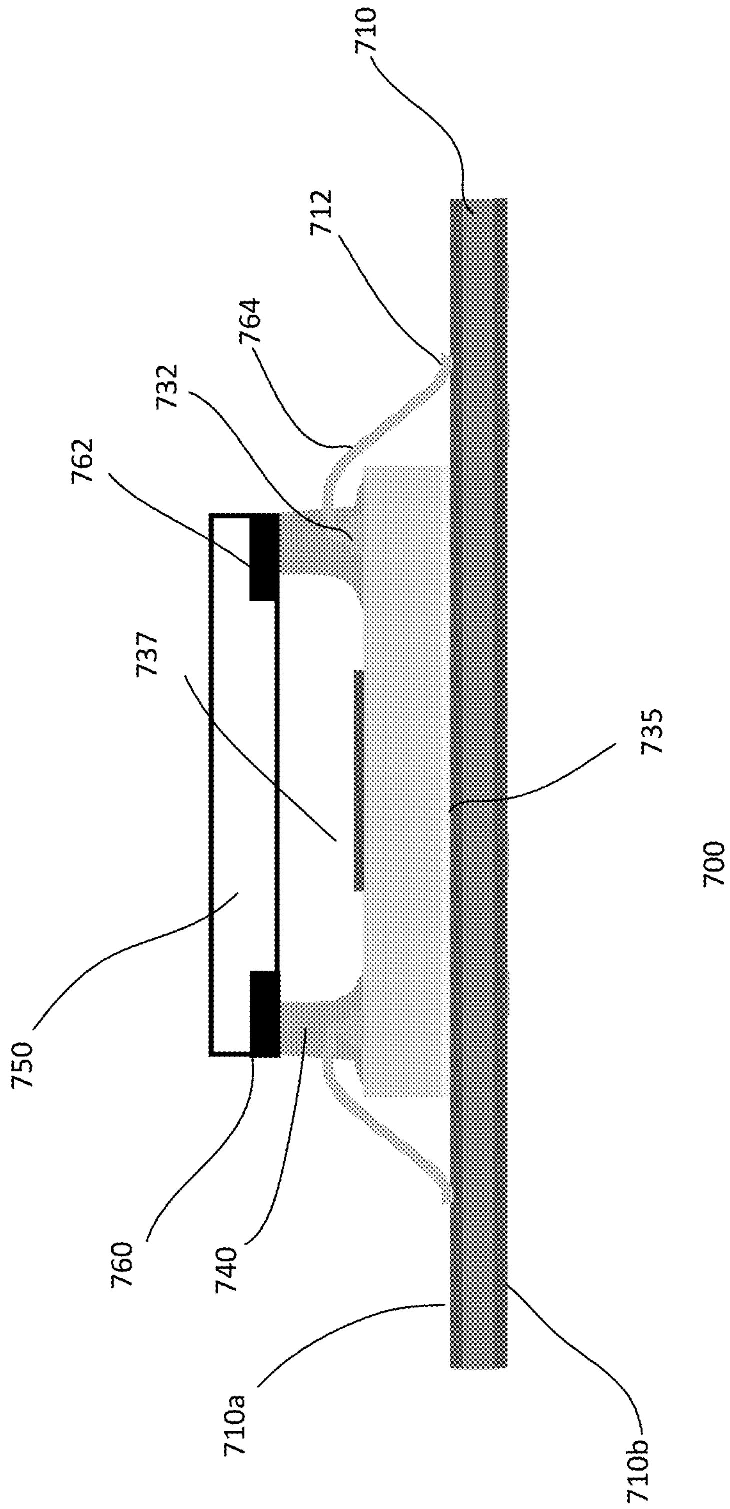
Figure 7D:
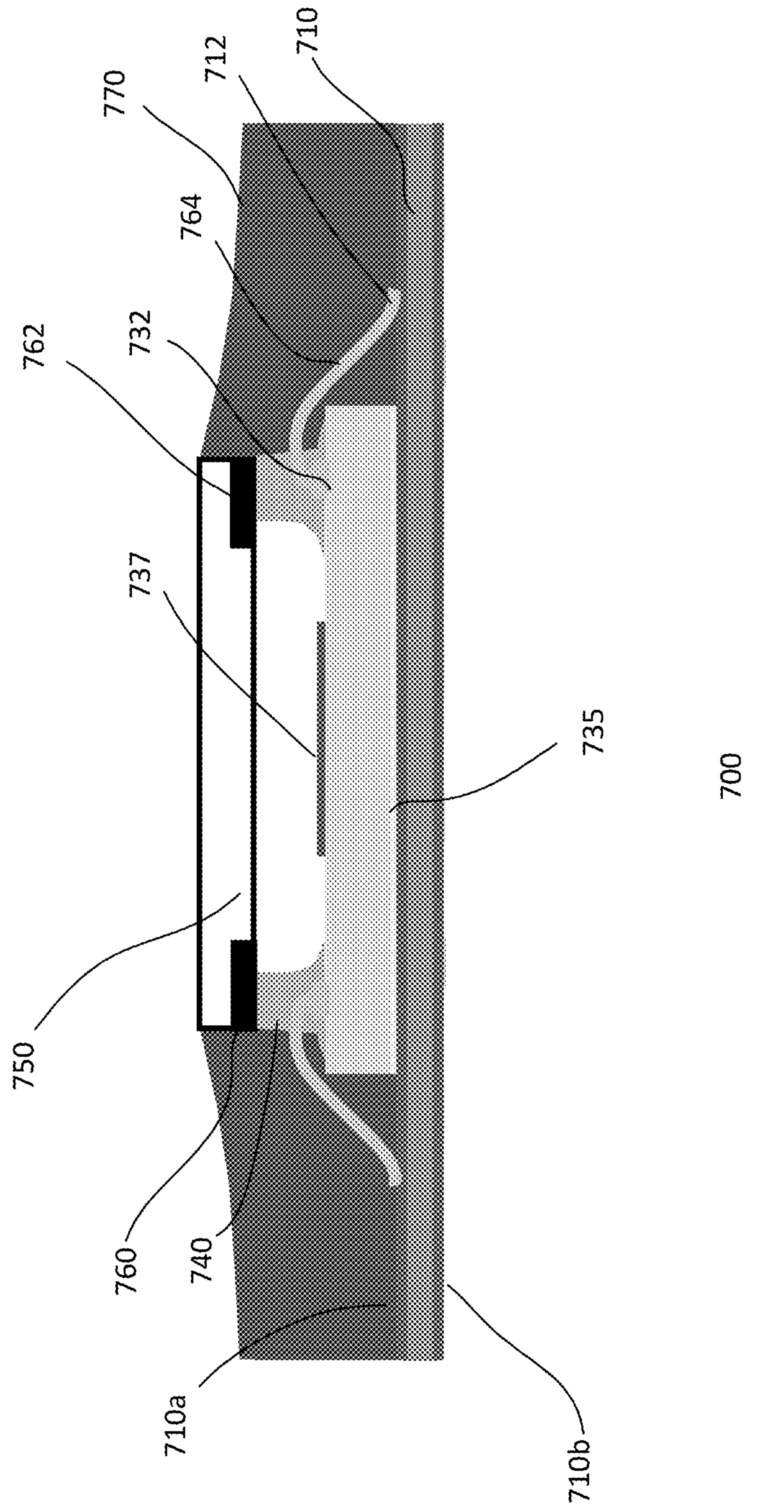
Figure 7E:
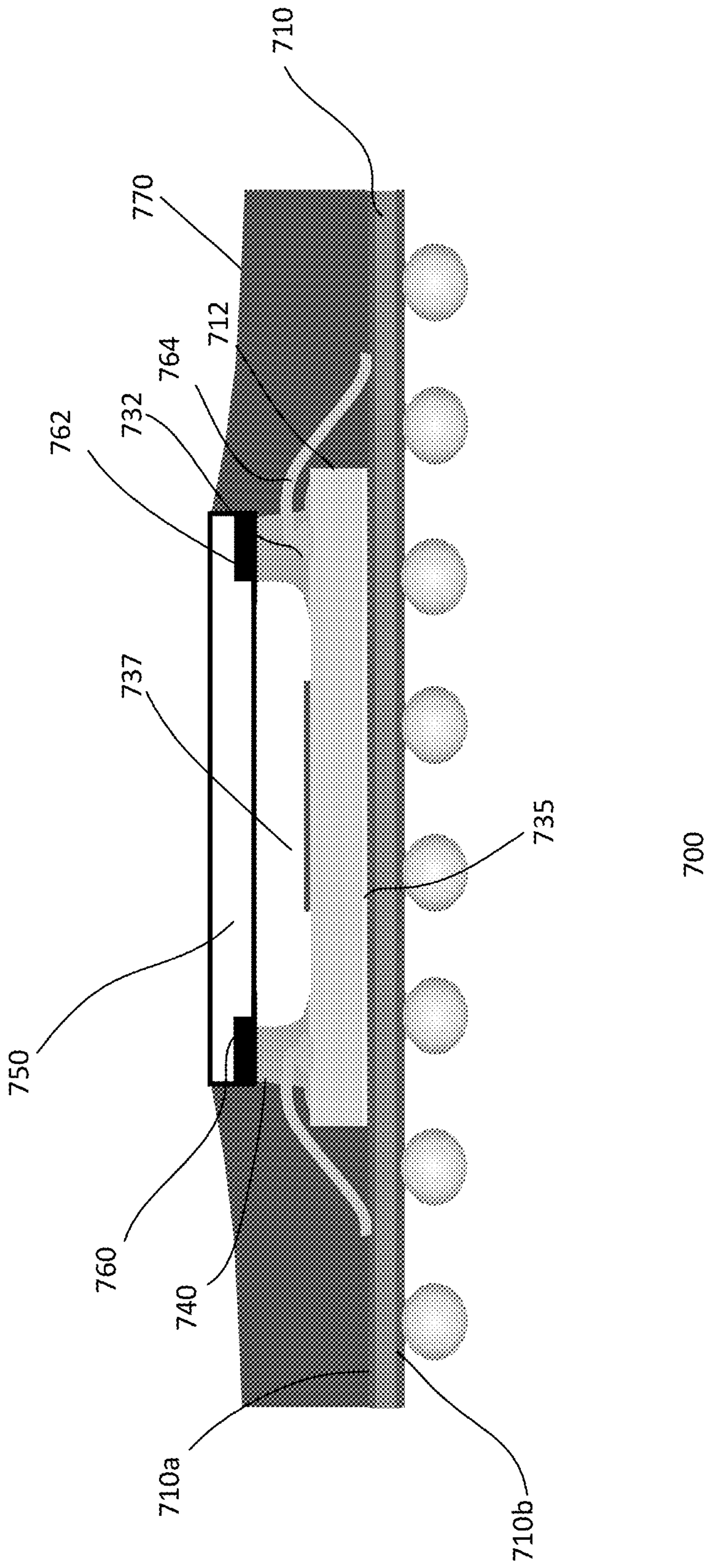

Referring to FIGS. 5*a*-5*c*, covers similar to FIGS. 2*b*$_2$ are formed. As shown in FIGS. 5*a*-5*b*, the process commences with forming opaque coatings 562 on opaque regions 560 disposed on the bottom surface 550*b* of the cover sheet 550. For example, opaque coatings are formed along first and second directions, such as x and y directions, of the cover sheet. In one embodiment, the opaque coating is an ink layer, such as a black ink layer, formed by ink deposition. Ink deposition, in one embodiment, includes inkjet printing. Other types of opaque coatings may also be useful. For example, the opaque coating may be LCP formed by injection molding.

In one embodiment, the cover sheet is singulated at positions corresponding to the opaque regions to form a plurality of cover 150 including opposing top and bottom cover surfaces 150*a* and 150*b* in FIG. 5*c*. The resulting protective covers may be similar to that shown in FIG. 2*b*$_3$, with opaque coatings 162 on the opaque regions 160 at the periphery of the bottom cover surface 150*b* of the cover.

As shown in FIGS. 6*a*-6*d*, covers similar to FIGS. 2*b*$_4$ are formed. The process commences with fully cutting the cover sheet 650 mounted on the protective film 680, forming a groove 666 extending from the bottom cover surface 650*b* to the top cover surface 650*a* of the cover sheet. An encapsulation process is performed after formation of the groove 666 to form opaque coatings 662 on opaque regions 660. The opaque coating, for example, may be an encapsulation layer, such as an epoxy mold compound (EMC). Alternatively, the opaque coating may be liquid crystal polymer (LCP) or ink, which has a high viscosity. The high viscosity results in a better control of volume of material dispensed to minimize spreading. Other types of opaque coatings, such as a solder mask coating, may also be useful.

The opaque coating may be formed by various techniques, such as injection molding, deposition and printing. For example, the opaque coating may be formed by inkjet printing. Other techniques may also be useful. In one embodiment, a tape may be employed as a deposition mask. For example, the tape exposes areas when the coating is deposited. The tape mask is removed after coating deposition. Alternatively, maskless techniques, such as thru dispensing using needle dispenser for specifically coating desired areas, may be employed.

The cover sheet is singulated at the opaque regions including opaque coatings to form a plurality of individual covers 150 with opposing top and bottom cover surfaces 150*a* and 150*b* as well as side surfaces, leaving opaque coatings 162 on the opaque region 160 at the periphery of the bottom cover surface and side surfaces of the cover. The opaque coating on the side surfaces protects side walls of the cover, reducing cracking during processing.

FIG. 7 shows a process flow 700 for an embodiment of forming a semiconductor package. The package, for example, is similar to those described in FIGS. 1$a$-1$b_4$. The package includes a cover similar to those described in FIGS. 2$a$, 2$b_1$-$b_4$ and those formed as described in FIGS. 3$a$-3$d$, 4$a$-4$e$, 5$a$-5$c$, and 6$a$-6$d$. Common elements may not be described or described in detail.

The process flow, for example, commences as FIG. 7$a$. For example, the process flow, as shown, is at a stage where dies are formed on a wafer and diced to form individual dies, and protective covers are formed using a cover substrate and diced to form individual covers. The process includes providing a package substrate 710. The package substrate may include top and bottom major surfaces 710$a$ and 710$b$. The top surface of the package substrate may include a die region and package bond pads disposed outside of the die region. The bottom surface of the package substrate may include package contacts which are interconnected to the package bond pads on the opposing surface, for example, by one or more metal layers and via contacts embedded in the package substrate.

A die 730 is attached to the die region, for example, by an adhesive 735. The adhesive may be an adhesive tape disposed on the die attach region. The die, for example, is temporarily attached to the die region. For example, a curing process may be performed to permanently attach the die to the die region. In one embodiment, the active die surface includes a sensor region 737. In the case of an image sensor chip, the sensor region may include a photosensitive sensor that may capture image information in response to light. The image sensor may be, for example, a CMOS or CCD type image sensor. Other types of sensors may also be useful. In one embodiment, the sensor region includes an array of sensors. For example, each sensor may correspond to a pixel of an image. The sensor chip may include CMOS components embedded in the chip for controlling the sensor chip. Other configurations of chips may also be useful.

The process, in one embodiment, forms wire bonds 764 at FIG. 7$b$. The wire bonds connect the die pads 732 on the top surface of the die to package bond pads 712 on the top surface of the package substrate.

A protective cover 750 having an opaque region 760 is attached to the die at FIG. 7$c$. The protective cover, for example, is a glass cover. Other types of protective cover may also be useful. The opaque region includes an opaque coating 762 disposed at a periphery of the bottom cover surface of the cover. In some embodiments, side surfaces of the cover may also include opaque regions. In such cases, the opaque coating covers side surfaces and opaque regions on the bottom cover surface of the cover.

An adhesive 740 is applied onto the cover adhesive region on the die. The adhesive, for example, may be a UV-curable adhesive. Other types of adhesives may also be useful. The adhesive may be applied by dispensing. Other techniques for applying the adhesive may also be useful.

The cover adhesive region, for example, surrounds the sensor region of the die. The cover adhesive region, in one embodiment, is disposed on a periphery portion of the die. For example, the die bond pads are disposed within the cover adhesive region. In such cases, the adhesive is disposed on the die bond pads and portions of the bond wires thereover.

The protective cover is placed on the adhesive and the package is cured to permanently attach the cover to the die. The protective cover includes opaque regions at the bottom surface of the protective cover, as discussed. The opaque regions may also be disposed at side walls of the cover. Curing processes like UV curing and thermal curing may be performed to permanently attaching the protective cover to the die.

An encapsulant 770, such as epoxy resin, is formed over the package substrate at FIG. 7$d$. The encapsulant covers the package substrate, exposed portions of the die and wire bonds, and sides of the protective cover. The epoxy may be formed by, for example, dispensing. Other techniques or materials may also be employed for the encapsulant. The encapsulant is cured thereafter.

Typically, the package substrate may include a leadframe with multiple package substrates. For example, the package substrates of the leadframe may be arranged in a matrix format, with rows and columns of package substrates. This facilitates parallel processing. For example, a plurality of dies are attached to the package substrates. After processing is completed, the leadframe is singulated, separating it into individual packages.

Figure 8:
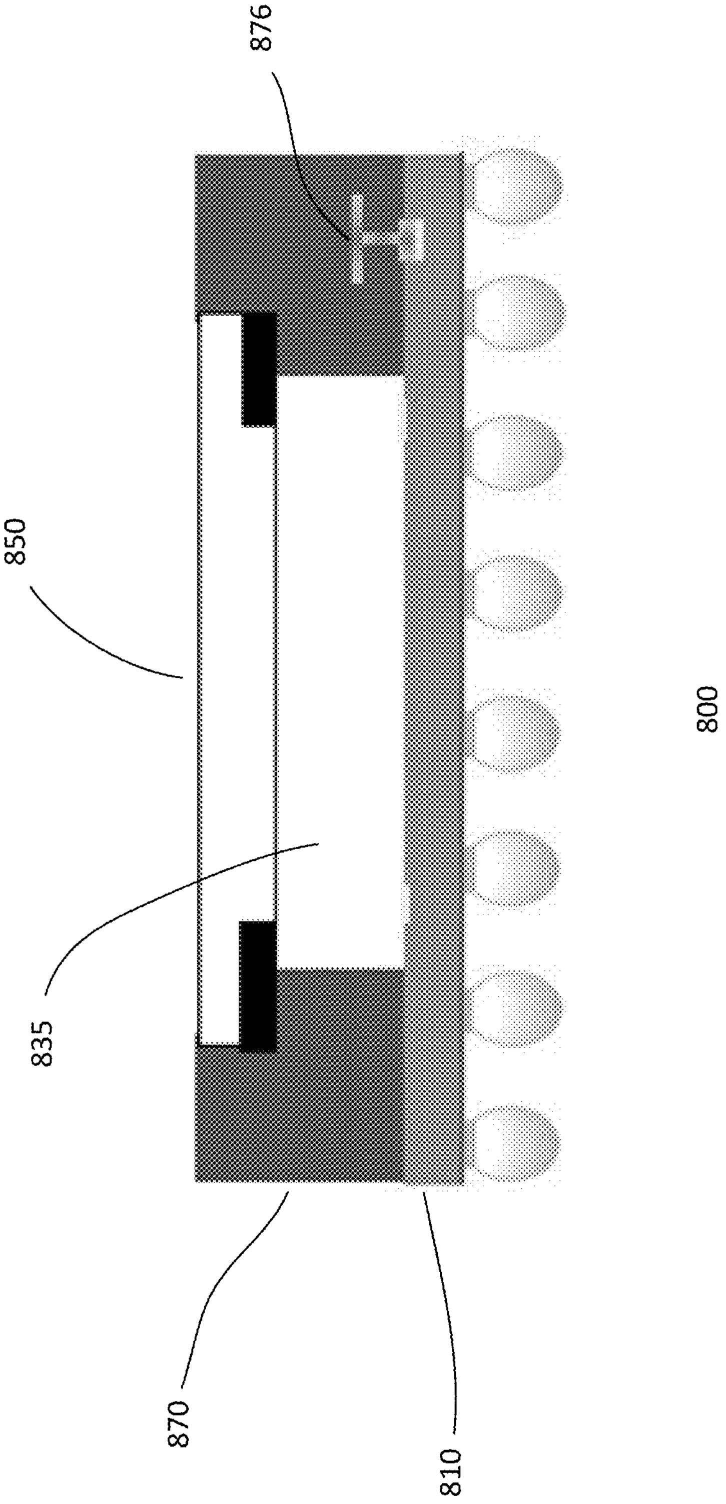
FIG. 8 shows a simplified cross-sectional view of another embodiment of a semiconductor package.

FIG. 8 shows another embodiment of a semiconductor package 800. The package includes a package substrate 810 with a preformed cavity 835. For example, a mold compound 870 is disposed on the package substrate and forms the cavity. The mold compound may include interlocks 876 to improve adhesion of the mold compound to the package substrate. within which a die is mounted. Various types of interlocks may be employed. A die (not shown) is attached to the package substrate in the cavity. Such types of packages are described in, for example, commonly-owned co-pending U.S. patent application Ser. No. 17/352,348, filed on Jun. 20, 2021, titled reliable semiconductor packages. As shown, a cover 850 with an opaque region, such as those described in FIGS. 2$b_1$-2$b_4$ may be employed. For example, the cavity of the package may serve as the base for the cover with the opaque region.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A semiconductor package comprising:

a package substrate having top and bottom major package substrate surfaces, the top major package surface includes a die region;

a die attached to the die region, the die includes

- a first major die surface, the first major die surface includes
  - a sensor region with a sensor,
  - a cover adhesive region surrounding the sensor region, and
- a second major surface, the second major surface is attached to the die region of the top major package surface;

a cover attached to the first major die surface, the cover includes top and bottom major cover surfaces and side cover surfaces, the cover comprises

- an opaque region disposed at a periphery of the bottom major cover surface of the cover, wherein the opaque region comprises a recessed structure with an opaque coating at the periphery of the bottom major cover surface which extends from the side cover surfaces of the cover, the opaque coating is disposed in the recessed structure and coplanar with the bottom major cover surface, the opaque region is configured to prevent flaring or scattering of light, and a cover bond region on a bottom major cover surface, the bottom major cover surface faces the die;

a cover adhesive, the cover adhesive is configured to attach the cover to the die to form a sealed cavity between the cover and sensor region, wherein the adhesive contacts the cover bond region on the bottom major cover surface and the cover adhesive region on the first major die surface; and an encapsulant, the encapsulant covers exposed portions of the package substrate, die and bond wires and side surfaces of the cover while leaving the first major cover surface exposed.

2. The semiconductor package of claim 1, wherein the opaque region is further disposed on the side cover surfaces and includes the opaque coating covering the side cover surfaces.

3. The semiconductor package of claim 1, wherein the opaque coating comprises an epoxy mold compound layer, a liquid crystal polymer (LCP) layer, an ink layer, or a solder mask.

4. The semiconductor package of claim 1, wherein the opaque region extends inwardly from the side cover surfaces about 25-50 um beyond the cover adhesive.

5. A semiconductor package comprising:

a package substrate having top and bottom major package substrate surfaces, the top major package surface includes a die region;

a die attached to the die region, the die includes a first major die surface, the first major die surface includes a sensor region with a sensor, a cover adhesive region surrounding the sensor region, and a second major surface, the second major surface is attached to the die region of the top major package surface;

a cover attached to the first major die surface, the cover includes top and bottom major cover surfaces and side cover surfaces, the cover comprises an opaque region, the opaque region includes a horizontal portion disposed at a periphery of the bottom major cover surface of the cover and a vertical portion at the side cover surfaces, the opaque region is configured to prevent flaring or scattering of light, and a cover bond region on a bottom major cover surface, the bottom major cover surface faces the die;

a cover adhesive, the cover adhesive is configured to attach the cover to the die to form a sealed cavity between the cover and sensor region, wherein the adhesive contacts the cover bond region on the bottom major cover surface and the cover adhesive region on the first major die surface; and an encapsulant, the encapsulant covers exposed portions of the package substrate, die and bond wires and side surfaces of the cover while leaving the first major cover surface exposed.

6. The semiconductor package of claim 5, wherein the opaque region comprises an opaque coating disposed on the opaque region.

7. The semiconductor package of claim 6, wherein the horizontal portion of the opaque region comprises a recessed structure below the periphery of the bottom cover surface, the opaque coating is disposed in the recessed structure and on the side cover surfaces, the opaque coating comprises a horizontal portion coplanar with the bottom cover surface.

8. The semiconductor package of claim 6, wherein the opaque coating is disposed on the periphery of the bottom cover surface and the side cover surfaces.

9. The semiconductor package of claim 6, wherein the opaque coating comprises an epoxy mold compound layer, a liquid crystal polymer (LCP) layer, an ink layer, or a solder mask.

10. The semiconductor package of claim 5, wherein the opaque region extends inwardly from the side cover surfaces about 25-50 um beyond the cover adhesive.

11. A cover for a semiconductor package comprising:

a top cover surface, and a bottom cover surface, wherein the top and bottom cover surfaces are parallel planar surfaces, and side cover surfaces; and wherein the bottom cover surface comprises a horizontal portion of an opaque region disposed at a periphery of the bottom cover surface, the side cover surfaces comprises a vertical portion of the opaque region, and the opaque region is configured to prevent flaring or scattering of light.

12. The cover of claim 11, wherein the opaque region comprises an opaque coating disposed on the opaque region.

13. A cover comprising:

a top cover surface;

a bottom cover surface, wherein the top and bottom cover surfaces are parallel planar surfaces;

side cover surfaces; and wherein the bottom cover surface comprises an opaque region disposed at a periphery of the bottom cover surface from the side cover surfaces, the opaque region comprises a recessed structure below the periphery of the bottom cover surface from the side cover surfaces, an opaque coating disposed in the recessed structure, the opaque coating is coplanar with the bottom cover surface, and the opaque region is configured to prevent flaring or scattering of light.

14. The cover of claim 12, wherein the opaque coating comprises an epoxy mold compound layer, a liquid crystal polymer (LCP) layer, an ink layer, or a solder mask.

15. The cover of claim 12, wherein the opaque region comprises an epoxy mold compound layer, a liquid crystal polymer (LCP) layer, an ink layer, or a solder mask.

16. The cover of claim 11, wherein the cover is a transparent cover.

17. The cover of claim 13 wherein:

the opaque region is further disposed on the side surfaces of the cover; and the opaque coating covers the opaque region disposed on the side surfaces of the cover.

18. The cover of claim 17, wherein the opaque coating comprises an epoxy mold compound layer, a liquid crystal polymer (LCP) layer, an ink layer, or a solder mask.

* * * * *